United States Patent
Lee et al.

(10) Patent No.: US 11,943,987 B2
(45) Date of Patent: Mar. 26, 2024

(54) COLOR CONVERSION SUBSTRATE

(71) Applicant: Samsung Display Co., LTD., Yongin-si (KR)

(72) Inventors: Gak Seok Lee, Hwaseong-si (KR); Byung Chul Kim, Suwon-si (KR); In Ok Kim, Osan-si (KR); Jae Min Seong, Suwon-si (KR); In Seok Song, Pocheon-si (KR); Keun Chan Oh, Hwaseong-si (KR); Ji Eun Jang, Suwon-si (KR); Chang Soon Jang, Seoul (KR); Sun Kyu Joo, Suwon-si (KR); Ha Lim Ji, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 410 days.

(21) Appl. No.: 16/899,078

(22) Filed: Jun. 11, 2020

(65) Prior Publication Data
US 2021/0005672 A1 Jan. 7, 2021

(30) Foreign Application Priority Data
Jul. 2, 2019 (KR) .................. 10-2019-0079412

(51) Int. Cl.
*H10K 59/38* (2023.01)
*H10K 50/86* (2023.01)

(52) U.S. Cl.
CPC ........... *H10K 59/38* (2023.02); *H10K 50/865* (2023.02)

(58) Field of Classification Search
CPC ............... H01L 27/322; H01L 51/5284; H01L 2251/5369; H01L 51/0096; H01L 27/156; H01L 33/507; H01L 33/58; H01L 27/3218; H01L 27/3211; H01L 27/3244; H01L 51/5262; G02B 5/201; Y02E 10/549;
(Continued)

(56) References Cited

U.S. PATENT DOCUMENTS 10,048,530 B1  8/2018 Kim et al.
10,802,341 B2  10/2020 Kim et al.
(Continued)

FOREIGN PATENT DOCUMENTS

EP  3 432 060  1/2019
EP  3 435 149  1/2019
(Continued)

OTHER PUBLICATIONS

Extended European Search Report corresponding to European Application or Patent No. 20183377.9 dated Nov. 19, 2020.

*Primary Examiner* — Duy T Nguyen
(74) *Attorney, Agent, or Firm* — KILE PARK REED & HOUTTEMAN PLLC

(57) ABSTRACT

A color conversion substrate and a display device are provided. The color conversion substrate includes a base substrate, a first color filter and a second color filter disposed on a surface of the base substrate, a first partition layer disposed between the first color filter and the second color filter, a second partition layer disposed on the first partition layer, a first wavelength conversion pattern disposed on the first color filter and a second wavelength conversion pattern disposed on the second color filter, wherein the first partition layer includes a first lower surface disposed on the first color filter and a second lower surface disposed on the second color filter.

24 Claims, 28 Drawing Sheets

(58) Field of Classification Search
CPC ...... Y02P 70/50; H10K 59/38; H10K 50/865;
H10K 2102/331; H10K 77/10; H10K
50/85; H10K 59/35; H10K 59/353; H10K
59/12
USPC .......................................................... 257/40
See application file for complete search history.

(56) References Cited

U.S. PATENT DOCUMENTS

| | | | |
|---|---|---|---|
| 2015/0171372 A1* | 6/2015 | Iwata ........................ | C09D 7/65 257/89 |
| 2016/0003998 A1 | 1/2016 | Benoit et al. | |
| 2016/0041430 A1 | 2/2016 | Lee et al. | |
| 2016/0170254 A1* | 6/2016 | Chae ................. | G02F 1/133345 438/23 |
| 2018/0267210 A1 | 9/2018 | Takeuchi et al. | |
| 2018/0277798 A1 | 9/2018 | Heo et al. | |
| 2019/0025634 A1 | 1/2019 | Park et al. | |

FOREIGN PATENT DOCUMENTS

| | | | | |
|---|---|---|---|---|
| JP | 2015-026417 | | 2/2015 | |
| JP | 2016-122606 | | 7/2016 | |
| JP | 2016122606 | * | 7/2016 | ............ H10K 59/38 |
| KR | 10-1281877 | | 7/2013 | |
| KR | 10-2015-0136938 | | 12/2015 | |
| KR | 10-2016-0056335 | | 5/2016 | |
| KR | 10-2018-0092326 | | 8/2018 | |
| WO | 2013/073521 | | 5/2013 | |

* cited by examiner

COLOR CONVERSION SUBSTRATE

CROSS-REFERENCE TO RELATED APPLICATION

This application claims priority to and benefits of Korean Patent Application No. 10-2019-0079412 under 35 U.S.C. § 119, filed in the Korean Intellectual Property Office on Jul. 2, 2019, the entire contents of which are incorporated herein by reference.

BACKGROUND

1. Technical Field

The disclosure relates to a color conversion substrate and a display device including the same.

2. Description of the Related Art

Display devices have become increasingly important with the development of multimedia. Accordingly, various types of display devices such as a liquid crystal display (LCD) device, an organic light emitting diode (OLED) display device and the like have been developed.

Among the display devices, an OLED display device may include an organic light emitting element which may be a self-luminous element. The organic light emitting element may include two opposing electrodes, and an organic light emitting layer interposed therebetween. Electrons and holes may be provided from the two electrodes and may be recombined in the light emitting layer to generate excitons, the generated excitons may change from an excited state to a ground state, and light may be emitted.

Since such a self-luminous display device does not require a separate light source, it may be configured as a thin and lightweight display device with low power consumption, and has advantageous quality characteristics such as a wide viewing angle, high luminance and contrast, and fast response speed. Thus, such an OLED display device has attracted attention as a next-generation display device.

SUMMARY

Aspects of the disclosure provide a color conversion substrate with improved process margin, including a plurality of partition layers.

Aspects of the disclosure also provide a display device with improved display quality, including a color conversion substrate.

However, aspects of the disclosure may not be restricted to those set forth herein. The above and other aspects of the disclosure will become more apparent to one of ordinary skill in the art to which the disclosure pertains by referencing the detailed description below.

A color conversion substrate according to an embodiment may include a first partition layer and a second partition layer, and the first partition layer may form a flat lower surface. Accordingly, the partition layer of the color conversion substrate may have a symmetrical structure between neighboring light transmitting regions, and the wavelength conversion pattern and the light transmission pattern located in each light transmission region may have a uniform volume. A display device according to an embodiment may include the color conversion substrate to improve display quality.

The effects of the disclosure may not be limited to the above-described effects and other effects which may not be described herein will become apparent to those skilled in the art from the following description.

According to an embodiment, a color conversion substrate may include a base substrate, a first color filter and a second color filter disposed on a surface of the base substrate, a first partition layer disposed between the first color filter and the second color filter, a second partition layer disposed on the first partition layer, a first wavelength conversion pattern disposed on the first color filter and a second wavelength conversion pattern disposed on the second color filter, wherein the first partition layer may include a first lower surface disposed on the first color filter and a second lower surface disposed on the second color filter.

The first color filter and the second color filter may be spaced apart from each other, and the first partition layer may include a third lower surface disposed on the surface of the base substrate.

The partition layer may include a portion of which side surface is inclined from the third lower surface toward ends of the first lower surface and the second lower surface.

The first lower surface and the second lower surface may be parallel to the surface of the base substrate.

A first width of the first partition layer may be larger than a distance between the first color filter and the second color filter.

A second width of the second partition layer may be smaller than the first width of the first partition layer.

The second width of the second partition layer may be larger than a distance between the first color filter and the second color filter.

A height of the first partition layer may be greater than a thickness of any of the first color filter and the second color filter.

A sum of heights of the first partition layer and the second partition layer may be greater than a height of the first wavelength conversion pattern.

The color conversion substrate may include a third color filter disposed on the one surface of the base substrate, a light transmission pattern disposed on the third color filter, a third partition layer disposed between the third color filter and the second color filter and a fourth partition layer disposed on the third partition layer.

At least a portion of the second color filter may be disposed on the first color filter, and the first partition layer may include a third lower surface disposed on the first color filter and the second color filter.

A width of a region where the first color filter and the second color filter overlap each other may be smaller than a width of the first partition layer.

The color conversion substrate may include a capping layer disposed on the first color filter, the second color filter and the surface of the base substrate.

The first partition layer may include a same material as the first color filter.

The first partition layer may be integrated with the first color filter.

According to an embodiment, a color conversion substrate may include a base substrate including a first light transmitting region, a second light transmitting region separated from the first light transmitting region in a first direction, and a first light blocking region between the first light transmitting region and the second light transmitting region, a first color filter disposed on a surface of the base substrate to overlap the first light transmitting region, a second color filter disposed on the surface of the base substrate to overlap the second light transmitting region, a partition wall overlapping the first light blocking region and disposed on one surface of the base substrate and a first wavelength conversion pattern disposed on the first color filter and a second wavelength conversion pattern disposed on the second color filter, wherein the partition wall includes a first partition layer disposed between the first color filter and the second color filter and a second partition layer disposed on the first partition layer, and the first partition layer includes a first lower surface disposed on the first color filter and a second lower surface disposed on the second color filter.

The first partition layer may further include a third lower surface disposed on the substrate of the base substrate, and a portion of which side surface is inclined from the third lower surface toward ends of the first lower surface and the second lower surface.

At least a portion of the first partition layer may overlap the first light transmitting region and the second light transmitting region.

A width of the first partition layer may be larger than a width of the first light blocking region.

The first color filter and the second color filter may extend in a second direction perpendicular to the first direction, and the partition wall may extend in the second direction.

The base substrate may include a third light transmitting region separated from the first light transmitting region in the second direction and a second light blocking region between the first light transmitting region and the third light transmitting region, wherein the partition wall may overlap the second light blocking region.

A width of the partition wall may be larger than a width of the second light blocking region.

According to an embodiment, a display device may include a display substrate including a first light emission region, a second light emission region separated from the first light emission region in a first direction, and a non-emission region between the first light emission region and the second light emission region; and a color conversion substrate disposed above the display substrate, wherein the color conversion substrate comprises a base substrate including a first light transmitting region, a second light transmitting region separated from the first light transmitting region in the first direction, and a first light blocking region defined between the first light transmitting region and the second light transmitting region, a first color filter and a second color filter disposed on a surface of the base substrate, a first partition layer disposed between the first color filter and the second color filter, a second partition layer disposed on the first partition layer, a first wavelength conversion pattern disposed on the first color filter and a second wavelength conversion pattern disposed on the second color filter, wherein the first partition layer includes a first lower surface disposed on the first color filter and a second lower surface disposed on the second color filter.

The first partition layer may further include a third lower surface disposed on the surface of the base substrate, and a portion of which side surface is inclined from the third surface toward ends of the first lower surface and the second lower surface.

The first color filter and the second color filter may be spaced apart from each other, and the first partition layer may further include a third lower surface disposed on the surface of the base substrate.

The first lower surface and the second lower surface may be parallel to the surface of the base substrate.

A first width of the first partition layer may be larger than a distance between the first color filter and the second color filter.

A second width of the second partition layer may be smaller than the first width of the first partition layer.

A height of the first partition layer may be greater than a thickness of the first color filter and the second color filter.

A height of the first partition layer may be greater than a thickness of any of the first color filter and the second color filter.

A sum of heights of the first partition layer and the second partition layer may be greater than a height of the first wavelength conversion pattern.

At least a portion of the first partition layer may overlap the first light transmitting region and the second light transmitting region.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
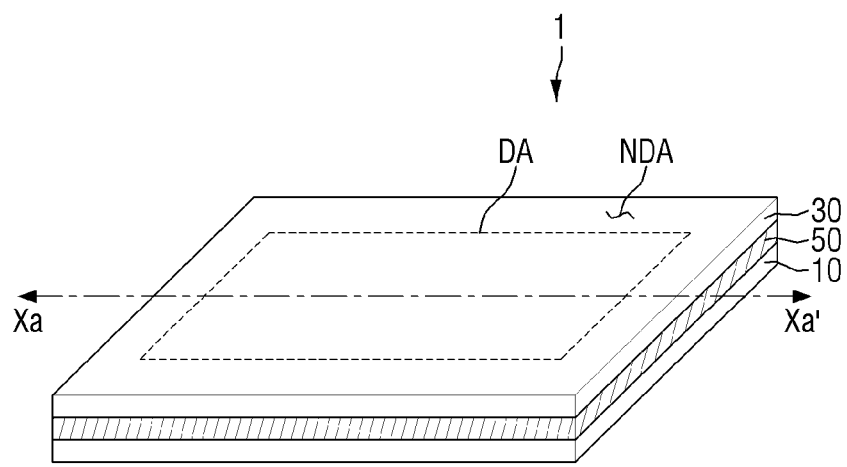
FIG. 1 shows a perspective view of a display device according to an embodiment.
Figure 1:
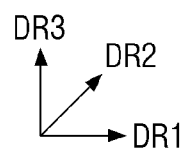

The embodiments herein will now be described more fully hereinafter with reference to the accompanying drawings. The embodiments may include different forms and should not be construed as limited to the descriptions thereof as set forth herein. Rather, these embodiments are provided so that this disclosure may be thorough and complete, and fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the disclosure. In contrast, when an element is referred to as being "directly on" another element, there may be no intervening elements present. The word "over" or "on" means positioning on or below an object portion, and does not necessarily mean positioning on the upper side of the object portion based on a gravity direction.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be understood that, although the terms "first," "second," "third," "fourth," etc. may be used herein to describe various elements, these elements should not be limited by these terms. These terms are only used to distinguish one element from another element. For instance, a first element discussed below could be termed one of a second element, a third element, and a fourth element without departing from the teachings herein.

In the drawings, the size and thickness of each element may be arbitrarily illustrated for ease of description, but the disclosure may not be necessarily limited to those embodiments illustrated in the drawings. In the drawings, the thicknesses of layers, films, panels, regions, etc., may be exaggerated for clarity.

Unless explicitly described to the contrary, the word "comprise" and variations such as "comprises" or "comprising" will be understood to imply the inclusion of stated elements but not the exclusion of any other elements. As used herein, the term "and/or" may include any and all combinations of one or more of the associated listed items. Expressions such as "at least one of," when preceding a list of elements, modify the entire list of elements and do not modify the individual elements of the list. As used herein, the term "and/or" may include any and all combinations of one or more of the associated listed items. Expressions such as "at least one of," when preceding a list of elements, modify the entire list of elements and do not modify the individual elements of the list.

In a case that a certain embodiment may be implemented differently, a specific process order may be performed differently from the described order. For example, two consecutively described processes may be performed substantially at the same time or performed in an order opposite to the described order.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within, for example, ±30%, 20%, or 5% of the stated value.

It will be understood that the terms "first," "second," etc. may be used herein to describe various components, these components should not be limited by these terms. These terms may only be used to distinguish one component from another.

As used herein, the singular forms "a," "an," and "the" are intended to include the plural forms as well, unless the context clearly indicates otherwise.

In the embodiments hereinafter, it will be understood that when an element, an area, or a layer is referred to as being connected to another element, area, or layer, it can be directly or indirectly connected to the other element, area, or layer. For example, it will be understood in this description that when an element, an area, or a layer is referred to as being in contact with or being electrically connected to another element, area, or layer, it may be directly or indirectly in contact with or electrically connected to the other element, area, or layer.

Further, the phrase "in a plan view" means when an object portion is viewed from above, and the phrase "in a cross-sectional view" means when a cross-section taken by vertically cutting an element portion is viewed from the side. Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art. When a layer, region, substrate, or area, is referred to as being "on" another layer, region, substrate, or area, it may be directly on the other region, substrate, or area, or intervening regions, substrates, or areas, may be present therebetween. Conversely, when a layer, region, substrate, or area, is referred to as being "directly on" another layer, region, substrate, or area, intervening layers, regions, substrates, or areas, may be absent therebetween. Further when a layer, region, substrate, or area, is referred to as being "below" another layer, region, substrate, or area, it may be directly below the other layer, region, substrate, or area, or intervening layers, regions, substrates, or areas, may be present therebetween. Conversely, when a layer, region, substrate, or area, is referred to as being "directly below" another layer, region, substrate, or area, intervening layers, regions, substrates, or areas, may be absent therebetween. Further, "over" or "on" may include positioning on or below an object and does not necessarily imply a direction based upon gravity.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the description.

Figure 2:
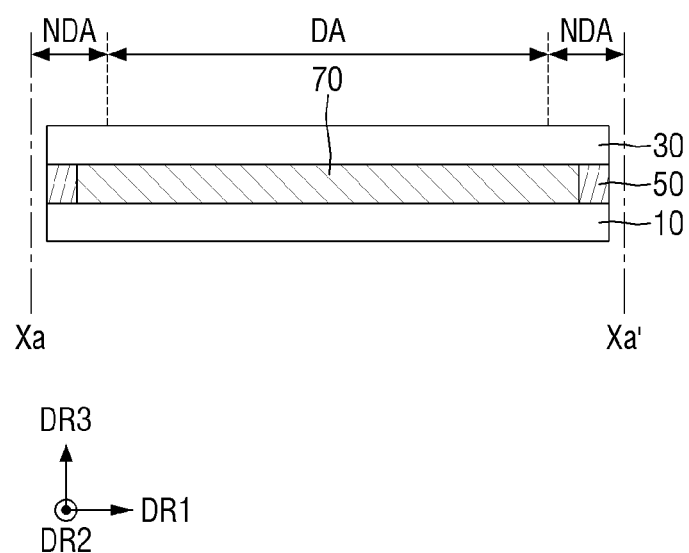
FIG. 2 shows a schematic cross-sectional view of a display device according to an embodiment, taken along line Xa-Xa' of FIG. 1.

FIG. 1 shows a perspective view of a display device according to an embodiment. FIG. 2 is a schematic cross-sectional view of a display device according to an embodiment, taken along line Xa-Xa' of FIG. 1.

Referring to FIGS. 1 and 2, a display device 1 may be applied to a variety of electronic devices, e.g., small and medium electronic devices such as a tablet PC, a smartphone, a car navigation unit, a camera, a center information display (CID) provided in a vehicle, a wristwatch-type electronic device, a personal digital assistant (PDA), a portable multimedia player (PMP) and a game console, and medium and large electronic devices such as a television, an external billboard, a monitor, a personal computer and a laptop computer. Theas above may represent mere examples for applying the display device 1, and thus one of ordinary skill in the art may recognize that the display device 1 may also be applied to other electronic devices without departing from the spirit and scope of the disclosure.

The display device 1 may have a rectangular shape in plan view. The display device 1 may include two first sides extending in a first direction DR1 and two second sides extending in a second direction DR2 intersecting the first direction DR1. A corner where the first side and the second side of the display device 1 meet may have a right angle. However, the corner may have a curved surface. The first side may be shorter than the second side. The planar shape of the display device 1 may be a circular shape or other shapes.

The display device 1 may include a display area DA for displaying an image and a non-display area NDA for not displaying an image. The non-display area NDA may be located around a periphery of the display area DA to surround the display area DA.

Unless otherwise defined, the terms "above," "upper side," "upper portion," "top," and "top surface," as used herein, refer to a direction indicated by an arrow in a third direction DR3 intersecting the first and second directions DR1 and DR2, and the terms "below," "lower side," "lower portion," "bottom," and "bottom surface," as used herein, refer to a direction opposite to the direction indicated by the arrow in the third direction DR3.

In one embodiment, the display device 1 may include a display substrate 10 and a color conversion substrate 30 overlapping or facing the display substrate 10. The display device 1 may include a sealing portion 50 for coupling the display substrate 10 and the color conversion substrate 30, and a filler 70 filled between the display substrate 10 and the color conversion substrate 30.

The display substrate 10 may include elements and circuits for displaying an image, for example, a pixel circuit such as a switching element, a pixel defining layer and a self-light-emitting element that may define a light emission region and a non-emission region in the display area DA. The self-light-emitting element may include at least one of an organic light emitting diode, a quantum dot light emitting diode, a micro light emitting diode (e.g., micro LED) based on inorganic materials and a nano light emitting diode (e.g., nano LED) based on inorganic materials. Herein, the self-light-emitting element may be an organic light emitting element.

The color conversion substrate 30 may be located above the display substrate 10 to face the display substrate 10. The color conversion substrate 30 may include a color conversion pattern for converting the color of incident light. The color conversion pattern may include at least one of a color filter and a wavelength conversion pattern.

The sealing portion 50 may be located between the display substrate 10 and the color conversion substrate 30 and in the non-display area NDA. The sealing portion 50 may be disposed along edges of the display substrate 10 and the color conversion substrate 30 in the non-display area NDA to surround or be around a periphery of the display area DA in plan view. The display substrate 10 and the color conversion substrate 30 may be coupled to each other through the sealing portion 50. The sealing portion 50 may be made of an organic material. For example, the sealing portion 50 may be made of an epoxy-based resin, but may not be limited thereto.

The filler 70 may be located in a space between the display substrate 10 and the color conversion substrate 30 and may be surrounded by, so as to be around, the sealing portion 50. The filler 70 may fill the space between the display substrate 10 and the color conversion substrate 30. The filler 70 may be made of a material that can transmit light. The filler 70 may be made of organic material. For example, the filler 70 may be formed of a silicon-based organic material, an epoxy-based organic material, or the like, but may not be limited thereto. The filler 70 may be omitted.

Figure 3:
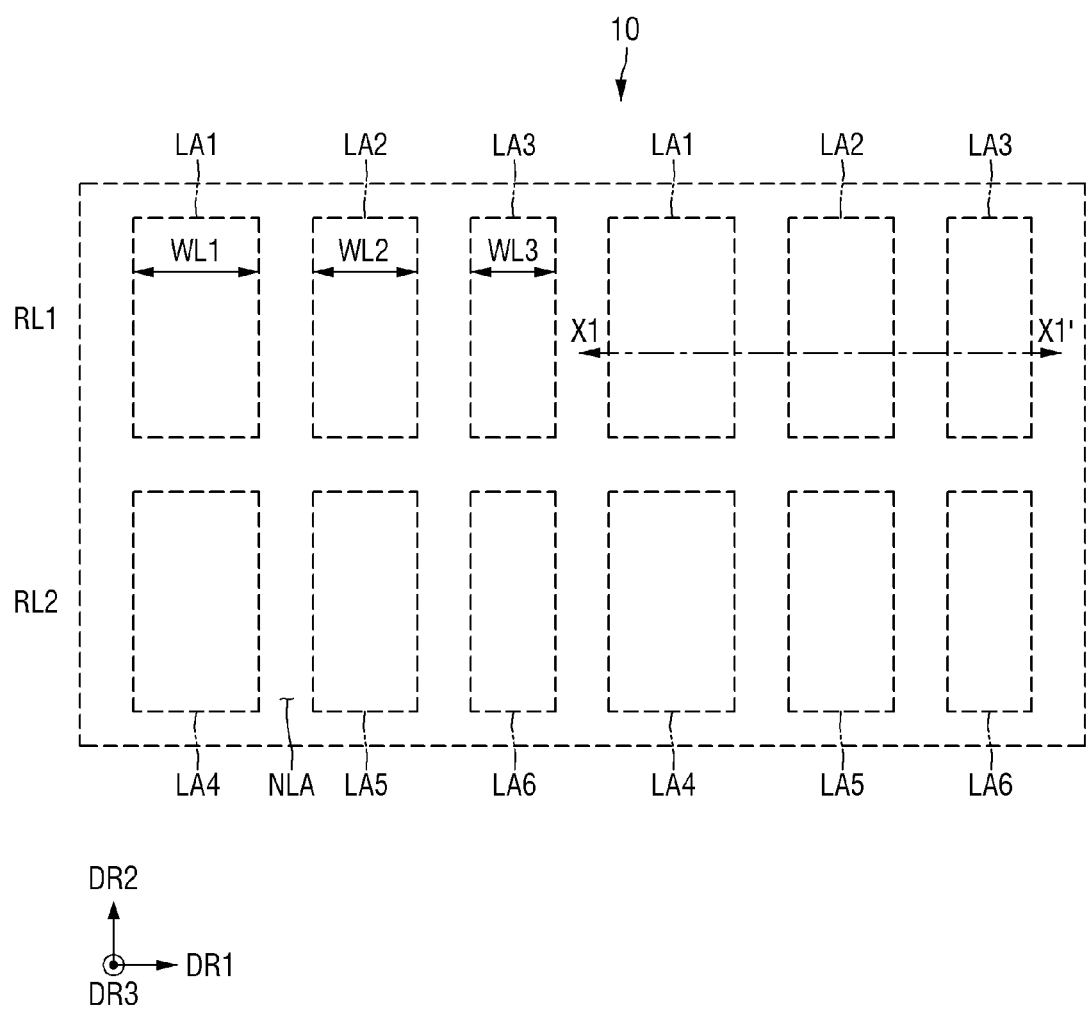
FIG. 3 shows a plan view of a display substrate in a display area of the display device illustrated in FIGS. 1 and 2.
Figure 4:
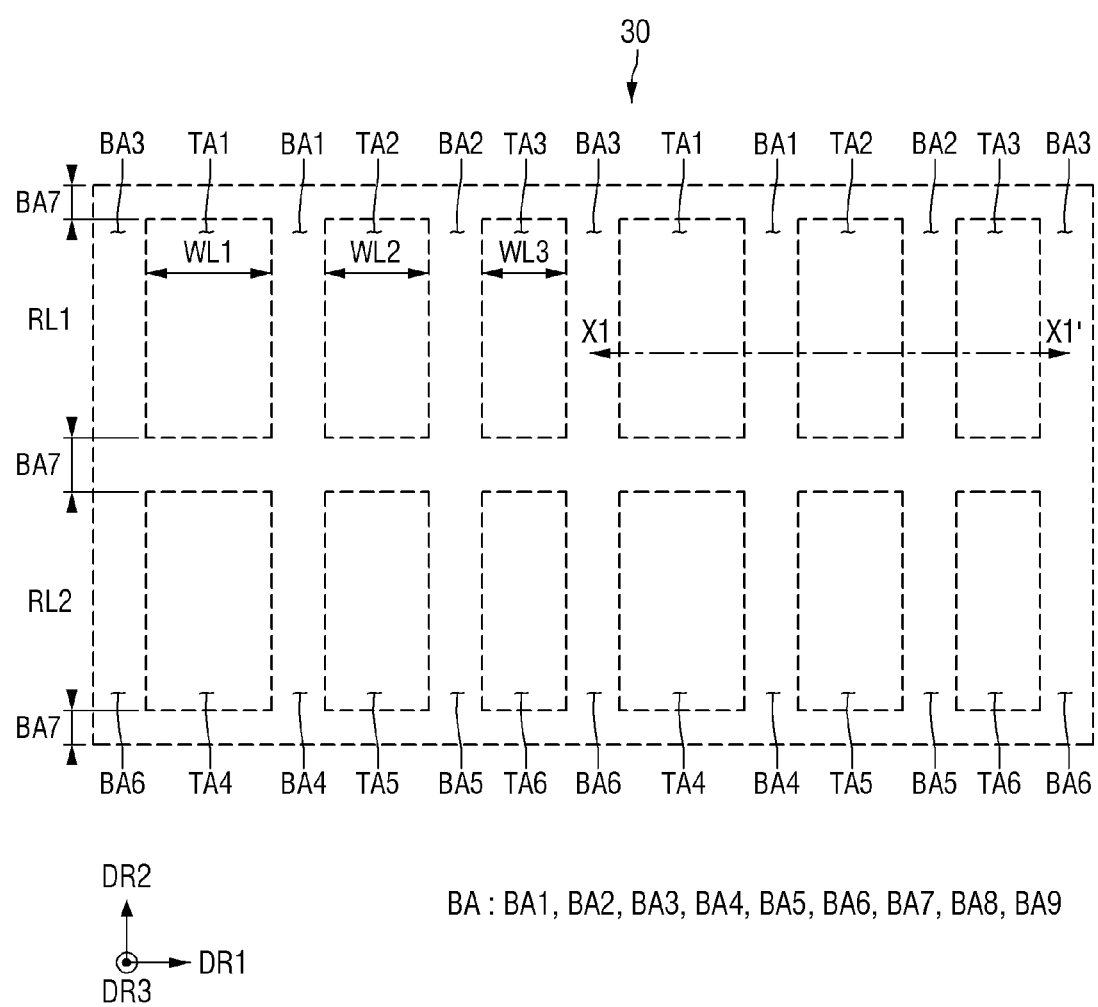
FIG. 4 shows a plan view of a color conversion substrate in the display area of the display device illustrated in FIGS. 1 and 2.

FIG. 3 shows a plan view of the display substrate in the display area of the display device illustrated in FIGS. 1 and 2. FIG. 4 shows a plan view of the color conversion substrate in the display area of the display device illustrated in FIGS. 1 and 2.

Referring to FIGS. 1 to 4, light emission regions LA1, LA2, LA3, LA4, LA5 and LA6 and a non-emission region NLA may be defined in the display area DA of the display substrate 10. The light emission regions LA1, LA2, LA3, LA4, LA5 and LA6 may be regions where light generated by the light emitting element of the display substrate 10 may be emitted to the outside of the display substrate 10, and the non-emission region NLA may be a region where light may not be emitted to the outside of the display substrate 10.

In an embodiment, the light emitted from the light emission regions LA1, LA2, LA3, LA4, LA5 and LA6 to the outside of the display substrate 10 may be light L having a specific center wavelength band. The light L may be blue light and may have a peak wavelength in a range of about 440 nm to about 480 nm.

The display substrate 10 may include the light emission regions LA1, LA2 and LA3 disposed in a first row RL1, and the light emission regions LA4, LA5 and LA6 disposed in a second row RL2 in the display area DA. In the display substrate 10, a first light emission region LA1, a second light emission region LA2 and a third light emission region LA3 may be disposed along the first direction DR1 in the first row RL1. The first light emission region LA1, the second light emission region LA2 and the third light emission region LA3 may be sequentially and repeatedly disposed along the first direction DR1. In the second row RL2 adjacent to the first row RL1 in the second direction DR2, a fourth light emission region LA4, a fifth light emission region LA5 and a sixth light emission region LA6 may be sequentially and repeatedly disposed along the first direction DR1.

A first width WL1 of the first light emission region LA1, which may be measured along the first direction DR1 may be larger than a second width WL2 of the second light emission region LA2 and a third width WL3 of the third light emission region LA3, which may be measured along the first direction DR1. The second width WL2 of the second light emission region LA2 and the third width WL3 of the third light emission region LA3 may be different from each other. For example, the second width WL2 of the second light emission region LA2 may be larger than the third width WL3 of the third light emission region LA3. An area of the first light emission region LA1 may be larger than an area of the second light emission region LA2 and an area of the third light emission region LA3, and the area of the second light emission region LA2 may be larger than the area of the third light emission region LA3.

However, the first width WL1 of the first light emission region LA1, the second width WL2 of the second light emission region LA2 and the third width WL3 of the third light emission region LA3 may be substantially the same. The area of the second light emission region LA2 may be smaller than that of the third light emission region LA3. The area of the first light emission region LA1, the area of the second light emission region LA2 and the area of the third light emission region LA3 may be substantially the same. Though the width of the display substrate 10 may gradually decrease from the first light emission region LA1 to the third light emission region LA3 with respect to such regions and as illustrated, the disclosure may not be limited thereto.

The fourth light emission region LA4 adjacent to the first light emission region LA1 in the second direction DR2 may be the same as the first light emission region LA1 except that the fourth light emission region LA4 may be located in the second row RL2. The width and the area of the fourth light emission region LA4 and the structure of the components disposed therein may be substantially the same as those of the first light emission region LA1. Similarly, the second light emission region LA2 and the fifth light emission region LA5 adjacent to each other in the second direction DR2 may have substantially the same structure, and the third light emission region LA3 and the sixth light emission region LA6 adjacent to each other in the second direction DR2 may have substantially the same structure.

The color conversion substrate 30 may overlap or face the display substrate 10. In the display area DA of the color conversion substrate 30, light transmitting regions TA1, TA2, TA3, TA4, TA5 and TA6 and a light blocking region BA may be defined. The light transmitting regions TA1, TA2, TA3, TA4, TA5 and TA6 may be regions where light emitted from the display substrate 10 passes through the color conversion substrate 30 and may be provided to the outside of the display device 1. The light blocking region BA may be a region where light emitted from the display substrate 10 may not be transmitted to the outside of the display device 1.

The color conversion substrate 30 may include the light transmitting regions TA1, TA2 and TA3 disposed in a first row RT1, and the light transmitting regions TA4, TA5 and TA6 in a second row RT2 in the display area DA. In the color conversion substrate 30, the first light transmitting region TA1, the second light transmitting region TA2 and the third light transmitting region TA3 may be disposed along the first direction DR1 in the first row RT1. In the color conversion substrate 30, the first light transmitting region TA1, the second light transmitting region TA2 and the third light transmitting region TA3 may be sequentially and repeatedly disposed along the first direction DR1.

The first light transmitting region TA1 may correspond to and overlap with or face the first light emission region LA1. Similarly, the second light transmitting region TA2 may correspond to and overlap with or face the second light emission region LA2, and the third light transmitting region TA3 may correspond to and overlap with or face the third light emission region LA3. The first light emission region LA1, the second light emission region LA2 and the third light emission region LA3 of the display substrate 10 may be sequentially and repeatedly disposed, and the first light transmitting region TA1, the second light transmitting region TA2 and the third light transmitting region TA3 which correspond to and overlap with or face them may also be sequentially and repeatedly disposed.

The light L provided from the display substrate 10 may be provided to the outside of the display device 1 after passing through the first light transmitting region TA1, the second light transmitting region TA2 and the third light transmitting region TA3. In a case that the light emitted from the first light transmitting region TA1 to the outside of the display device 1, such light may be referred to as first exit light, and the light emitted from the second light transmitting region TA2 to the outside of the display device 1 may be referred to as second exit light and the light emitted from the third light transmitting region TA3 to the outside of the display device 1 may be referred to as third exit light. The first exit light may be light of a first color, the second exit light may be light of a second color different from the first color, and the third exit light may be light of a third color different from the first color and the second color. The light of the first color may be red light having a peak wavelength in a range of about 610 nm to about 650 nm as described above, and the light of the second color may be green light having a peak wavelength in a range of about 510 nm to about 550 nm. The light of the third color may be blue light having a peak wavelength in a range of about 440 nm to about 480 nm.

In the second row RT2 adjacent to the first row RT1 in the second direction DR2, the fourth light transmitting region TA4, the fifth light transmitting region TA5 and the sixth light transmitting region TA6 may be disposed. The fourth light transmitting region TA4, the fifth light transmitting region TA5 and the sixth light transmitting region TA6 may also be sequentially and repeatedly disposed along the first direction DR1 in the second row RT2. The fourth light transmitting region TA4 may correspond to and overlap with or face the fourth light emission region LA4, the fifth light transmitting region TA5 may correspond to and overlap with or face the fifth light emission region LA5, and the sixth light transmitting region TA6 may correspond to and overlap with or face the sixth light emission region LA6.

The first light transmitting region TA1, the second light transmitting region TA2 and the third light transmitting region TA3 may have a width WT measured in the first direction DR1, relative to the first light emission region LA1, the second light emission region LA2 and the third light emission region LA3. For example, a first width WT1 of the first light transmitting region TA1, which may be measured along the first direction DR1 may be larger than a second width WT2 of the second light transmitting region TA2 and a third width WT3 of the third light transmitting region TA3, which may be measured along the first direction DR1. The second width WT2 of the second light transmitting region TA2 and the third width WT3 of the third light transmitting region TA3 may be different from each other. For example, the second width WT2 of the second light transmitting region TA2 may be larger than the third width WT3 of the third light transmitting region TA3.

An area of the first light transmitting region TA1 may be larger than an area of the second light transmitting region TA2 and an area of the third light transmitting region TA3, and the area of the second light transmitting region TA2 may be larger than the area of the third light transmitting region TA3. The fourth light transmitting region TA4, the fifth light transmitting region TA5 and the sixth light transmitting region TA6, which may be adjacent to the light transmitting regions TA1, TA2 and TA3 in the second direction DR2, may each have substantially the same width, area, structure of components disposed therein and color of light emitted to the outside of the display device 1.

In the color conversion substrate 30, the light blocking region BA may be located around the light transmission regions TA1, TA2, TA3, TA4, TA5 and TA6 in the display area DA. In a case that the light blocking region BA may be divided into regions, the light blocking region BA may include a first light blocking region BA1, a second light blocking region BA2, a third light blocking region BA3, a fourth light blocking region BA4, a fifth light blocking region BA5, a sixth light blocking region BA6 and a seventh light blocking region BA7.

The first light blocking region BA1 may be located between the first light transmitting region TA1 and the second light transmitting region TA2 along the first direction DR1. The second light blocking region BA2 may be located between the second light transmitting region TA2 and the third light transmitting region TA3 along the first direction DR1. The third light blocking region BA3 may be located between the third light transmitting region TA3 and another first light transmitting region TA1 along the first direction DR1.

The fourth light blocking region BA4 may be located between the fourth light transmitting region TA4 and the fifth light transmitting region TA5 along the first direction DR1. The fifth light blocking region BA5 may be located between the fifth light transmitting region TA5 and the sixth light transmitting region TA6 along the first direction DR1. The sixth light blocking region BA6 may be located between the sixth light transmitting region TA6 and another fourth light transmitting region TA4 along the first direction DR1.

The seventh light blocking region BA7 may be located between the first row RT1 and the second row RT2 adjacent to each other in the second direction DR2. Although not shown, the seventh light blocking region BA7 may be located between rows other than the first row RT1 and the second row RT2.

Figure 5:
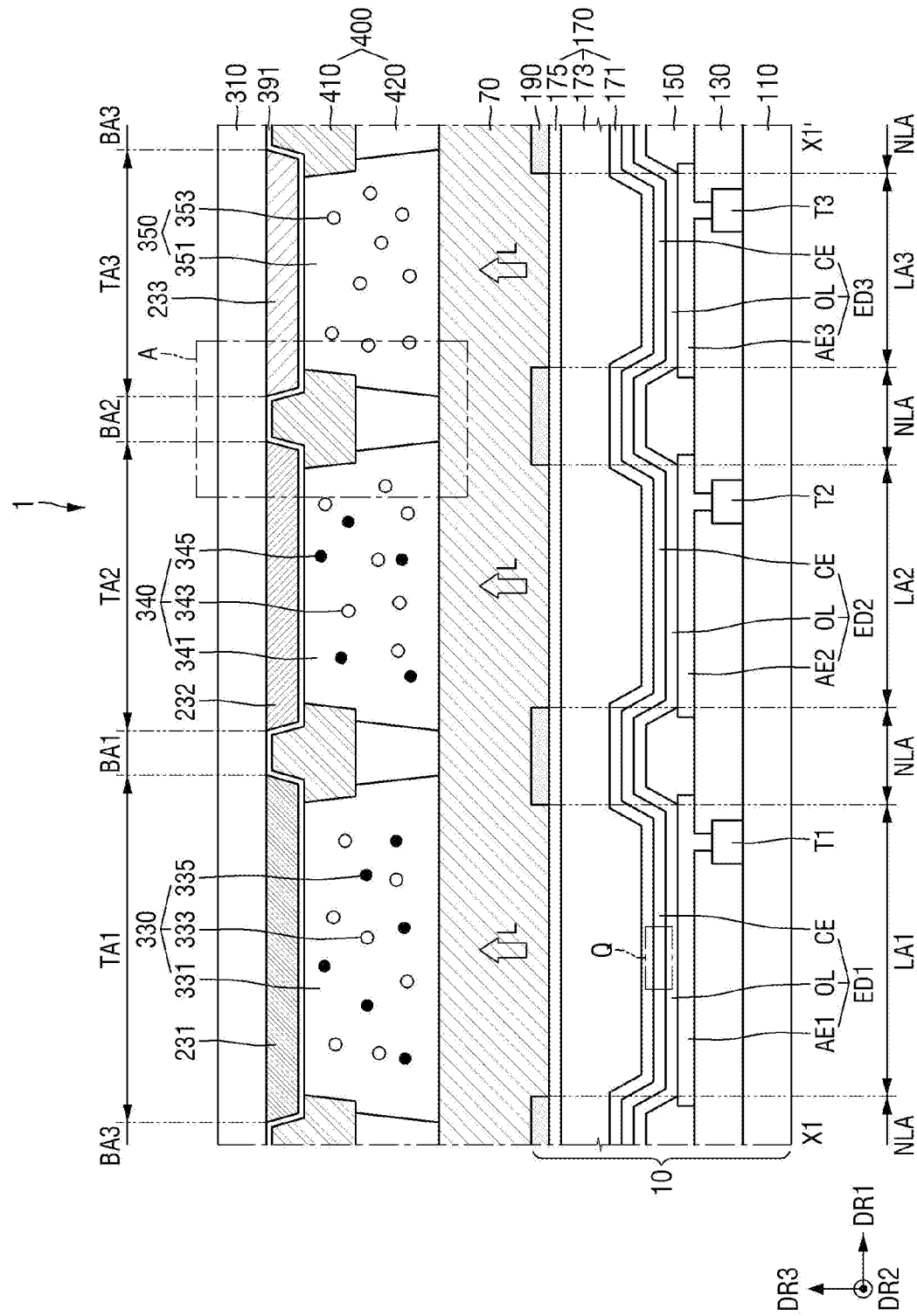
FIG. 5 shows a schematic cross-sectional view of the display device taken along line X1-X1' of FIGS. 3 and 4.

FIG. 5 shows a schematic cross-sectional view of the display device taken along line X1-X1' of FIGS. 3 and 4.

FIG. 5 illustrates cross sections of the first light emission region LA1, the second light emission region LA2 and the third light emission region LA3 of the display substrate 10, and the first light transmitting region TA1, the second light transmitting region TA2 and the third light transmitting region TA3 of the color conversion substrate 30.

Referring to FIG. 5 in addition to FIGS. 3 and 4, as described above, the display device 1 may include the display substrate 10 and the color conversion substrate 30, and may further include the filler 70 located between the display substrate 10 and the color conversion substrate 30.

The display substrate 10 may include a first base substrate 110 and switching elements T1, T2 and T3 disposed on the first base substrate 110.

The first base substrate 110 may be made of a light transmitting material. The first base substrate 110 may be a glass substrate or a plastic substrate. In a case that the first base substrate 110 may be a plastic substrate, the first base substrate 110 may have flexibility. The first base substrate 110 may include a separate layer, e.g., a buffer layer or an insulating layer, disposed on the glass substrate or the plastic substrate. The light emission regions LA1, LA2, LA3, LA4, LA5 and LA6 and a non-emission region NLA may be defined in the first base substrate 110.

The switching elements T1, T2 and T3 may be located on the first base substrate 110. The first switching element T1 may be located in the first light emission region LA1, the second switching element T2 may be located in the second light emission region LA2, and the third switching element T3 may be located in the third light emission region LA3. In another embodiment, at least one of the first switching element T1, the second switching element T2 and the third switching element T3 may be located in the non-emission region NLA.

Each of the first switching element T1, the second switching element T2 and the third switching element T3 may be a thin film transistor including polysilicon or a thin film transistor including an oxide semiconductor.

Although not shown in the drawing, signal lines (e.g., gate lines, data lines and power lines) for transmitting signals to each switching element may be further disposed on the first base substrate 110.

An insulating layer 130 may be located on the first switching element T1, the second switching element T2 and the third switching element T3. The insulating layer 130 may be a planarization layer. The insulating layer 130 may be formed of an organic layer. For example, the insulating layer 130 may include acrylic resin, epoxy resin, imide resin, ester resin, or the like. The insulating layer 130 may include a positive photosensitive material or a negative photosensitive material.

A first anode electrode AE1, a second anode electrode AE2 and a third anode electrode AE3 may be disposed on the insulating layer 130. The first anode electrode AE1 may be located in the first light emission region LA1, and at least a portion thereof may extend to the non-emission region NLA. The second anode electrode AE2 may be located in the second light emission region LA2, and at least a portion thereof may extend to the non-emission region NLA. The third anode electrode AE3 may be located in the third light emission region LA3, and at least a portion thereof may extend to the non-emission region NLA. The first anode electrode AE1 may be connected to the first switching element T1 through the insulating layer 130, and the second anode electrode AE2 may be connected to the second switching element T2 through the insulating layer 130. The third anode electrode AE3 may be connected to the third switching element T3 through the insulating layer 130.

The widths or areas of the first anode electrode AE1, the second anode electrode AE2 and the third anode electrode AE3 may be different from each other. For example, the width of the first anode electrode AE1 may be larger than the width of the second anode electrode AE2, and the width of the second anode electrode AE2 may be smaller than the width of the first anode electrode AE1 and larger than the width of the third anode electrode AE3. As another example, the area of the first anode electrode AE1 may be larger than the area of the second anode electrode AE2, and the area of the second anode electrode AE2 may be smaller than the area of the first anode electrode AE1 and larger than the area of the third anode electrode AE3. However, the disclosure may not be limited thereto, and the area of the first anode electrode AE1 may be smaller than the area of the second anode electrode AE2, and the area of the third anode electrode AE3 may be larger than the area of the second anode electrode AE2 and the area of the first anode electrode AE1. The widths or areas of the first anode electrode AE1, the second anode electrode AE2 and the third anode electrode AE3 may be substantially the same.

The first anode electrode AE1, the second anode electrode AE2 and the third anode electrode AE3 may be reflective electrodes. The first anode electrode AE1, the second anode electrode AE2 and the third anode electrode AE3 may be a metal layer containing metal such as Ag, Mg, Al, Pt, Pd, Au, Ni, Nd, Ir and Cr. In another embodiment, the first anode electrode AE1, the second anode electrode AE2 and the third anode electrode AE3 may include a metal oxide layer stacked on the metal layer. The first anode electrode AE1, the second anode electrode AE2 and the third anode electrode AE3 may have a double-layer structure of ITO/Ag, Ag/ITO, ITO/Mg or ITO/MgF, or may have a multilayer structure of, e.g., ITO/Ag/ITO.

A pixel defining layer 150 may be positioned on the first anode electrode AE1, the second anode electrode AE2 and the third anode electrode AE3. The pixel defining layer 150 may include an opening exposing the first anode electrode AE1, an opening exposing the second anode electrode AE2 and an opening exposing the third anode electrode AE3, and may define the first light emission region LA1, the second light emission region LA2, the third light emission region LA3 and the non-emission region NLA. For example, a region of the first anode electrode AE1 which may be exposed by the pixel defining layer 150 may be the first light emission region LA1. Similarly, a region of the second anode electrode AE2 which may be exposed by the pixel defining layer 150 may be the second light emission region LA2, and a region of the third anode electrode AE3 which may be exposed by the pixel defining layer 150 may be the third light emission region LA3. A region where the pixel defining layer 150 may located may be the non-emission region NLA, such that the non-emission region NLA may not be exposed by the pixel defining layer 150.

The pixel defining layer 150 may include an organic insulating material selected from the group consisting of acrylic resin, epoxy resin, phenolic resin, polyamide resin, polyimide resin, unsaturated polyester resin, polyphenylene resin, polyphenylenesulfide resin and benzocyclobutene (BCB).

A portion of the pixel defining layer 150 may be located to overlap or face a partition wall 400. For example, as illustrated in FIG. 5, the pixel defining layer 150 may overlap or face the partition wall 400 that may be located in the light blocking region BA.

A light emitting layer OL may be located on the first anode electrode AE1, the second anode electrode AE2 and the third anode electrode AE3. The light emitting layer OL may have a shape of a continuous film formed over the light emission regions LA1, LA2, LA3, LA4, LA5 and LA6 and the non-emission region NLA. A cathode electrode CE may be located on the light emitting layer OL. The cathode electrode CE may have a semi-transmissive or transmissive property. In a case that the cathode electrode CE may have a semi-transmissive property, the cathode electrode CE may include Ag, Mg, Cu, Al, Pt, Pd, Au, Ni, Nd, Ir, Cr, Li, Ca, LiF/Ca, LiF/Al, Mo, Ti or a compound or mixture thereof, such as a mixture of Ag and Mg. In a case that the cathode electrode CE may have a thickness of tens to hundreds of angstroms, the cathode electrode CE may have a semi-transmissive property.

In a case that the cathode electrode CE may have a transmissive property, the cathode electrode CE may include transparent conductive oxide (TCO). For example, the cathode electrode CE may include tungsten oxide (WxOx), titanium oxide (TiO$_2$), indium tin oxide (ITO), indium zinc oxide (IZO), zinc oxide (ZnO), indium tin zinc oxide (ITZO), magnesium oxide (MgO) or the like.

The first anode electrode AE1, the light emitting layer OL and the cathode electrode CE may constitute a first light emitting element ED1. The second anode electrode AE2, the light emitting layer OL and the cathode electrode CE may constitute a second light emitting element ED2. The third anode electrode AE3, the light emitting layer OL and the cathode electrode CE may constitute a third light emitting element ED3. Each of the first light emitting element ED1, the second light emitting element ED2 and the third light emitting element ED3 may emit emission light L, and the emission light L may be provided to the color conversion substrate 30.

The light emitting layer OL of the light emitting element ED may include a plurality of layers that may be stacked. Further description thereof follows below with reference to FIGS. 6 to 8.

Figure 6:
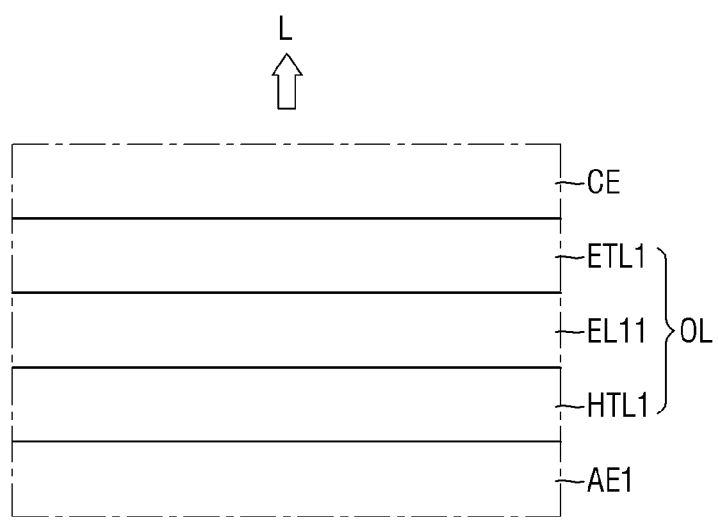
FIG. 6 shows an enlarged schematic cross-sectional view of portion Q of FIG. 5.
Figure 7:
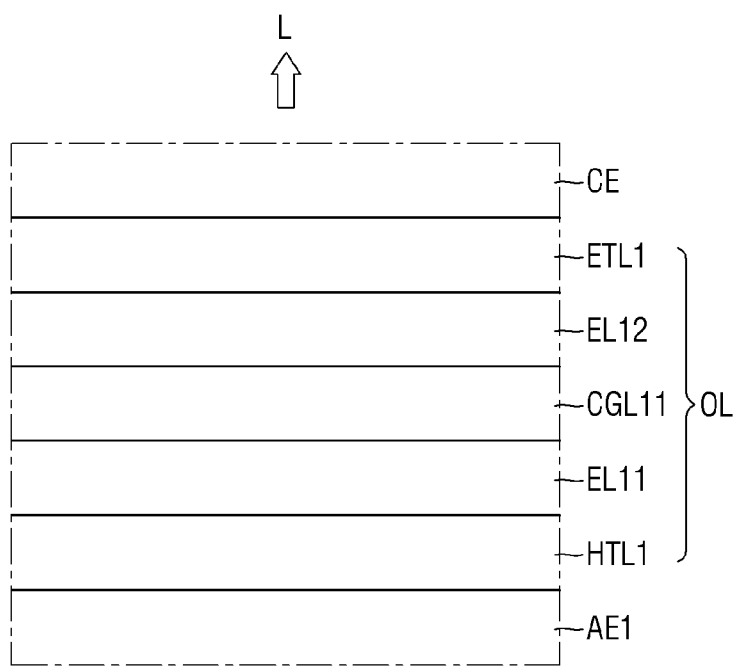
FIGS. 7 and 8 show schematic cross-sectional views showing a modification of the structure shown in FIG. 6.
Figure 8:
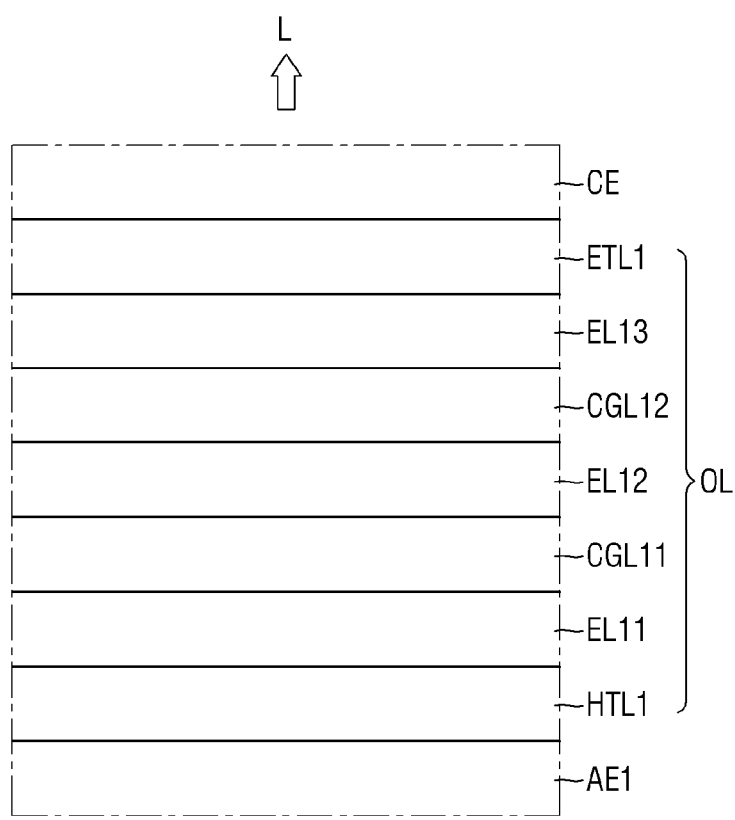

FIG. 6 shows an enlarged schematic cross-sectional view of portion Q of FIG. 5. FIGS. 7 and 8 show schematic cross-sectional views showing a modification of the structure shown in FIG. 6.

Referring to FIGS. 6 to 8, the light emitting layer OL may include a first hole transport layer HTL1 located on the first anode electrode AE1, a first light emitting material layer EL11 located on the first hole transport layer HTL1 and a first electron transport layer ETL1 located on the first light emitting material layer EL11. The light emitting layer OL may include one light emitting layer, for example, the first light emitting material layer EL11 as a light emitting layer. The first light emitting material layer EL11 may be a blue light emitting layer. However, the stacked structure of the light emitting layer OL may not be limited to the structure of FIG. 6, and may be modified as shown in FIGS. 7 and 8, for example.

Referring to FIG. 7, the light emitting layer OL may include a first charge generating layer CGL11 located on the first light emitting material layer EL11 and a second light emitting material layer EL12 located on the first charge generating layer CGL11. The first electron transport layer ETL1 may be located on the second light emitting material layer EL12.

The first charge generating layer CGL11 may inject charges into adjacent light emitting layers. The first charge generating layer CGL11 may adjust a charge balance between the first light emitting material layer EL11 and the second light emitting material layer EL12. The first charge generating layer CGL11 may include an n-type charge generating layer and a p-type charge generating layer. The p-type charge generating layer may be disposed on the n-type charge generating layer.

The second light emitting material layer EL12 may emit blue light similarly to the first light emitting material layer EL11. The second light emitting material layer EL12 may emit blue light having the same peak wavelength as or a different peak wavelength from the first light emitting material layer EL11. In another embodiment, the first light emitting material layer EL11 and the second light emitting material layer EL12 may emit light of different colors. For example, the first light emitting material layer EL11 may emit blue light and the second light emitting material layer EL12 may emit green light.

The light emitting layer OL having the above-described structure may include two light emitting layers, and may thereby improve light emission efficiency and lifetime compared to the structure of FIG. 6.

FIG. 8 illustrates that the light emitting layer OL may include three light emitting material layers EL11, EL12 and EL13 and two charge generating layers CGL11 and CGL12 interposed therebetween. As shown in FIG. 8, the light emitting layer OL may include a first charge generating layer CGL11 located on a first light emitting material layer EL11, a second light emitting material layer EL12 located on the first charge generating layer CGL11, a second charge generating layer CGL12 located on the second light emitting material layer EL12, and a third light emitting material layer EL13 located on the second charge generating layer CGL12. The first electron transport layer ETL1 may be located on the third light emitting material layer EL13.

The third light emitting material layer EL13 may emit blue light similarly to the first light emitting material layer EL11 and the second light emitting material layer EL12. In an embodiment, each of the first light emitting material layer EL11, the second light emitting material layer EL12 and the third light emitting material layer EL13 may emit blue light, and all of them may have the same wavelength peak. As another example, some of them may have different wavelength peaks. In another embodiment, the emission colors of the first light emitting material layer EL11, the second light emitting material layer EL12 and the third light emitting material layer EL13 may be different. For example, each of the light emitting layers may emit blue or green light, or the light emitting layers may emit red, green and blue light, respectively, to emit white light as a whole.

Referring again to FIG. 5, a thin film encapsulation layer 170 may be disposed on the cathode electrode CE. The thin film encapsulation layer 170 may be commonly disposed in or across the first light emission region LA1, the second light emission region LA2, the third light emission region LA3 and the non-emission region NLA. The thin film encapsulation layer 170 may directly cover the cathode electrode CE. A capping layer (not shown) covering the cathode electrode CE may be further disposed between the thin film encapsulation layer 170 and the cathode electrode CE. The thin film encapsulation layer 170 may directly cover the capping layer.

The thin film encapsulation layer 170 may include a first encapsulation inorganic layer 171, an encapsulation organic layer 173 and a second encapsulation inorganic layer 175 sequentially stacked on the cathode electrode CE.

Each of the first encapsulation inorganic layer 171 and the second encapsulation inorganic layer 175 may be formed of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride and/or the like.

The encapsulation organic layer 173 may be formed of acrylic resin, methacrylic resin, polyisoprene, vinyl resin, epoxy resin, urethane resin, cellulose resin, perylene resin and/or the like.

However, the structure of the thin film encapsulation layer 170 may not be limited to the above. The stacked structure of the thin film encapsulation layer 170 may be variously changed.

A panel light blocking member 190 may be located on the thin film encapsulation layer 170. The panel light blocking member 190 may be located on the thin film encapsulation layer 170 and may be located in the non-emission region NLA. The panel light blocking member 190 may prevent light interference between adjacent light emission regions, which may cause color mixture, so as to thereby improve color reproducibility.

The panel light blocking member 190 may be disposed in the non-emission region NLA to surround or be around each of the light emission regions LA1, LA2, LA3, LA4, LA5 and LA6 in plan view.

The panel light blocking member 190 may include an organic light blocking material, and may be formed through a coating and exposure process for an organic light blocking material.

Figure 9:
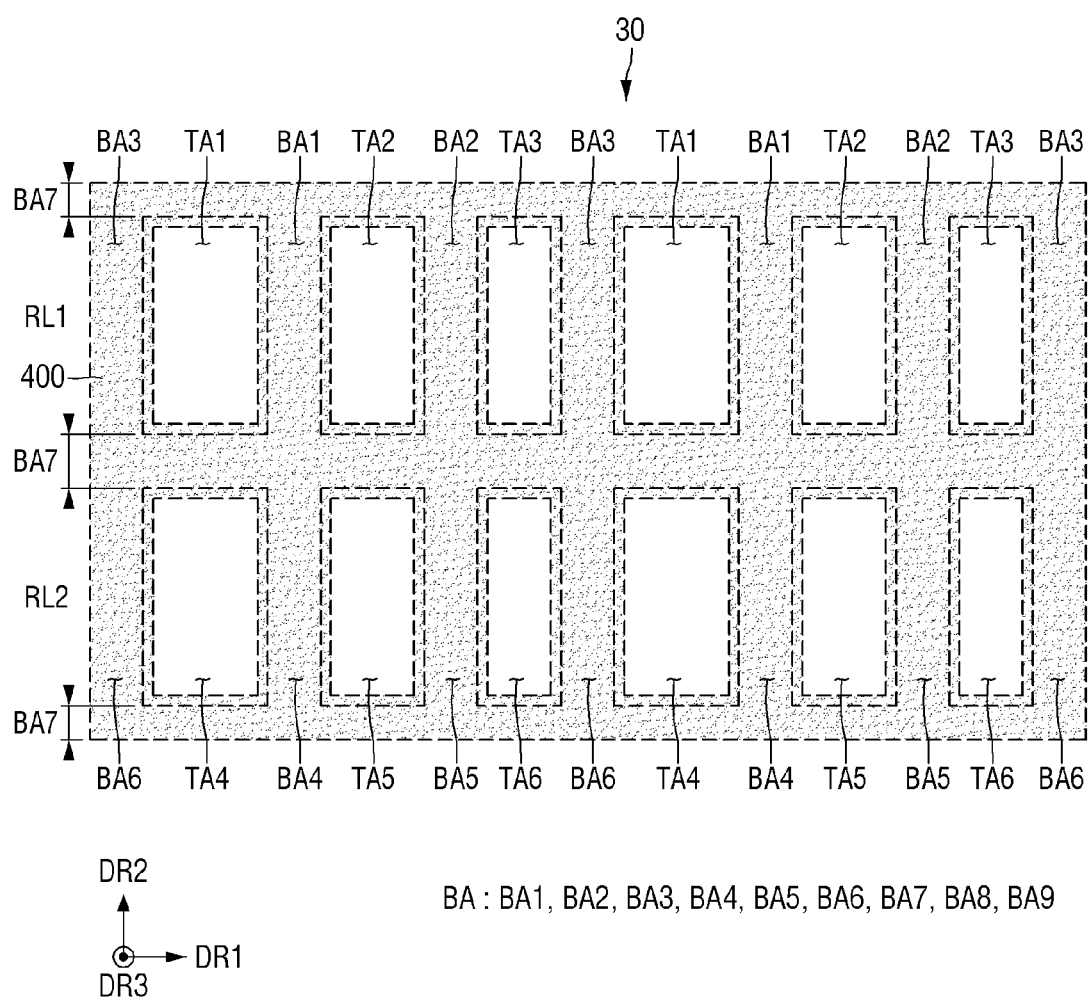
FIG. 9 shows a plan view showing an arrangement structure of a partition wall in a color conversion substrate according to an embodiment.
Figure 10:
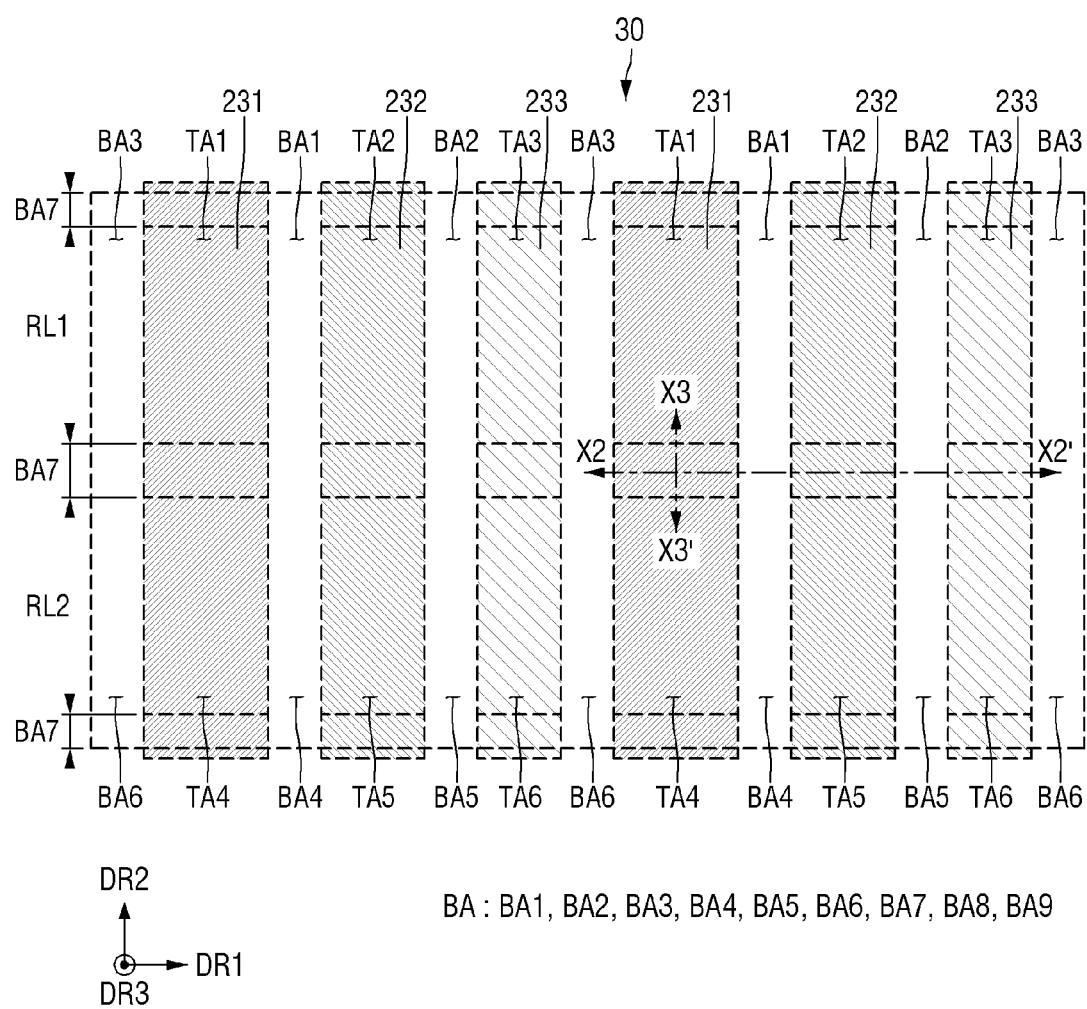
FIG. 10 shows a plan view illustrating an arrangement structure of a first color filter, a second color filter, and a third color filter in a color conversion substrate according to an embodiment.
Figure 11:
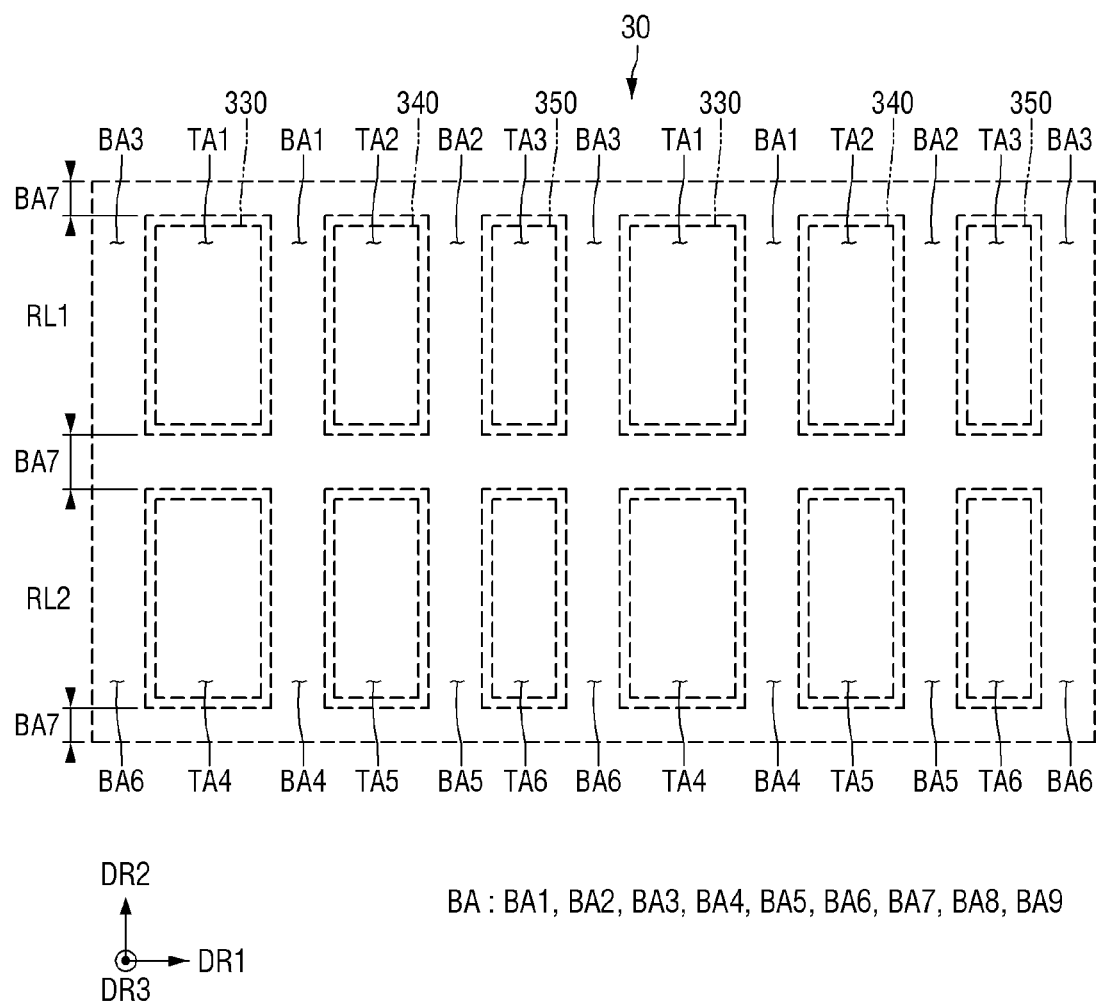
FIG. 11 shows a plan view illustrating an arrangement structure of a first wavelength conversion pattern, a second wavelength conversion pattern and a light transmission pattern in a color conversion substrate according to an embodiment.
Figure 12:
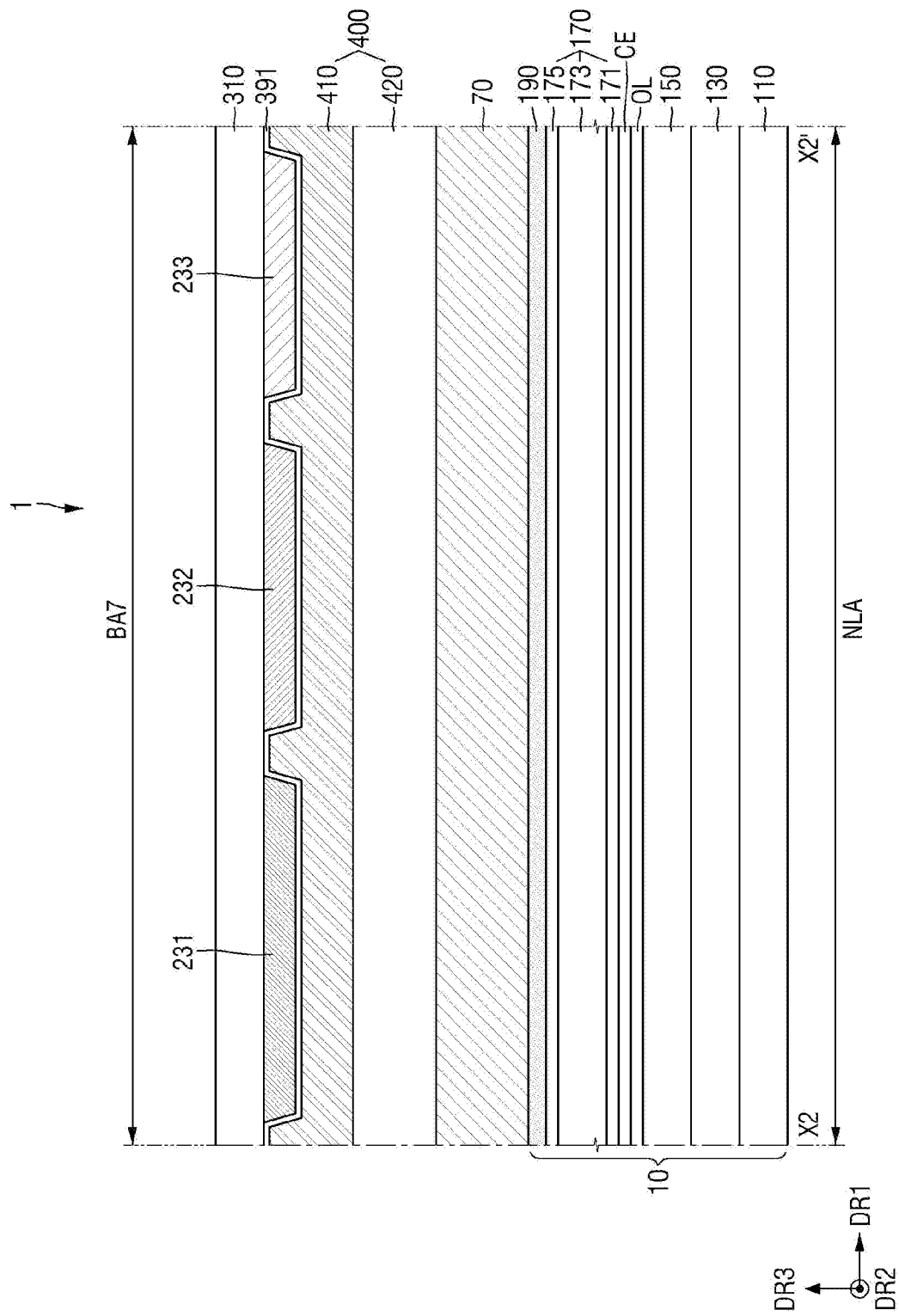
FIG. 12 shows a schematic cross-sectional view of a display device taken along line X2-X2' of FIG. 11.
Figure 13:
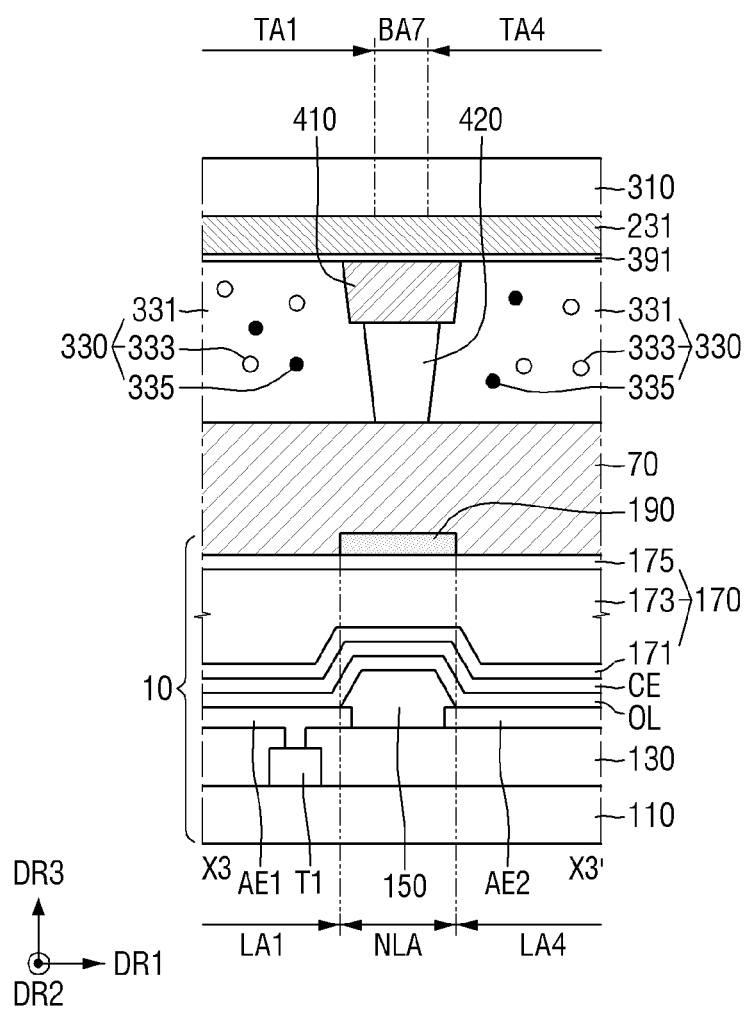
FIG. 13 shows a schematic cross-sectional view of a display device taken along line X3-X3' of FIG. 11.

FIG. 9 shows a plan view showing an arrangement of a partition wall in a color conversion substrate according to an embodiment. FIG. 10 shows a plan view illustrating an arrangement structure of a first color filter, a second color filter, and a third color filter in a color conversion substrate according to an embodiment. FIG. 11 shows a schematic plan view illustrating an arrangement of a first wavelength conversion pattern, a second wavelength conversion pattern and a light transmission pattern in a color conversion substrate according to an embodiment. FIG. 12 shows a schematic cross-sectional view of a display device taken along line X2-X2' of FIG. 11. FIG. 13 shows a schematic cross-sectional view of a display device taken along line X3-X3' of FIG. 11.

Referring to FIGS. 9 to 13 in addition to FIG. 5, the color conversion substrate 30 may include a second base substrate 310, color filters 231, 232 and 233, a partition wall 400, wavelength conversion patterns 330 and 340 and a light transmission pattern 350.

The second base substrate 310 may be made of a light transmitting material. The second base substrate 310 may include a glass substrate or a plastic substrate. The second base substrate 310 may include a separate layer, for example, an insulating layer such as an inorganic layer, located on the glass substrate or the plastic substrate. As described above, the light transmitting regions TA1, TA2, TA3, TA4, TA5 and TA6 and the light blocking region BA may be defined in the second base substrate 310 as shown in FIG. 4. The color filters 231, 232 and 233 and the partition wall 400 may be located on one surface of the second base substrate 310 facing the display substrate 10.

The color filters may include a first color filter 231, a second color filter 232 and a third color filter 233.

The first color filter 231 may be located on one surface of the second base substrate 310 and may be located in the first light transmitting region TA1 and the fourth light transmitting region TA4. The first color filter 231 located in the first light transmitting region TA1 and the first color filter 231 located in the fourth light transmitting region TA4 may be connected to each other along the second direction DR2. For example, as illustrated in FIG. 10, the first color filter 231 located in the first row RT1 may extend in the second direction DR2 and may be connected to the first color filter 231 located in the second row RT2. The partition wall 400 may be disposed in a region where the first color filter 231 may extend in the second direction DR2 and overlaps or faces the seventh light blocking region BA7. The partition wall 400 may extend in the first direction DR1 in the seventh light blocking region BA7 to separate the first light transmitting region TA1 and the fourth light transmitting region TA4 in the second direction DR2.

However, the disclosure may not be limited thereto. For example, the first color filter 231 located in the first light transmitting region TA1 and the first color filter 231 located in the fourth light transmitting region TA4 may be spaced apart from each other. For example, the respective first color filters 231 may be connected in a stripe shape to extend in the second direction DR2 or disposed in an island shape to be separated in the second direction DR2. Herein, the term, "island shape," may mean that a first element may be separated from a second element.

The first color filter 231 may selectively transmit light of the first color (e.g., red light) and may block or absorb light of the second color (e.g., green light) and light of the third color (e.g., blue light). The first color filter 231 may be a red color filter, and may include a red colorant such as a red dye or a red pigment. The term "colorant" as used herein may be understood as including both a dye and a pigment.

Similarly to the first color filter 231, the second color filter 232 and the third color filter 233 may also be located on one surface of the second base substrate 310. The second color filter 232 may be located in the second light transmitting region TA2 and the fifth light transmitting region TA5, and the third color filter 233 may be located in the third light transmitting region TA3 and the sixth light transmitting region TA6. In a case that the second color filter 232 and the third color filter 233 extend in the second direction DR2, the second color filter 232 and the third color filter 233 located in the first row RT1 may be connected to the second color filter 232 and the third color filter 233 located in the second row RT2. The partition wall 400 may be located in a region where the second color filter 232 and the third color filter 233 overlap or face the seventh light blocking region BA7. However, the disclosure may not be limited thereto. The second color filter 232 and the third color filter 233 may be spaced apart from each other between the first row RT1 and the second row RT2. For example, the second color filter 232 and the third color filter 233 may be connected in a stripe shape to extend in the second direction DR2 or disposed in an island shape to be separated in the second direction DR2.

The second color filter 232 may selectively transmit light of the second color (e.g., green light) and may block or absorb light of the first color (e.g., red light) and light of the third color (e.g., blue light). The second color filter 232 may be a green color filter, and may include a green colorant such as a green dye and a green pigment.

The third color filter 233 may selectively transmit light of the third color (e.g., blue light) and may block or absorb light of the second color (e.g., green light) and light of the first color (e.g., red light). The third color filter 233 may be a blue color filter, and may include a blue colorant such as a blue dye and a blue pigment.

According to an embodiment, the first color filter 231, the second color filter 232 and the third color filter 233 may be spaced apart from each other. Referring to FIGS. 5 and 10, the first color filter 231, the second color filter 232 and the third color filter 233 may extend in the second direction DR2, respectively, and may be disposed to be spaced apart in the first direction DR1. The first color filter 231, the second color filter 232 and the third color filter 233 may extend in the second direction DR2, respectively, in the first light transmitting region TA1, the second light transmitting region TA2 and the third light transmitting region TA3. Each of the first color filter 231, the second color filter 232 and the third color filter 233 may have a stripe shape extending along the second direction DR2, and cross the seventh light blocking region BA7 between the first row RT1 and the second row RT2.

However, the disclosure may not be limited thereto. In another embodiment, at least one of the first color filter 231, the second color filter 232 and the third color filter 233 may be disposed to be separated by the seventh light blocking region BA7 between the first row RT1 and the second row RT2 along the second direction DR2. For example, the first color filter 231, the second color filter 232 and the third color filter 233 may have an island shape so as to achieve their separation. In some cases, the first color filter 231, the second color filter 232 and the third color filter 233 may be disposed to overlap or face each other. The bottom surface of one color filter may be in contact with the top surface of another color filter.

As described above, since the first light transmitting region TA1, the second light transmitting region TA2 and the third light transmitting region TA3 may have different widths, the first color filter 231, the second color filter 232 and the third color filter 233 may also have different widths. The first light blocking region BA1, the second light blocking region BA2 and the third light blocking region BA3 may be located in regions between the first color filter 231, the second color filter 232 and the third color filter 233 which may be spaced apart from each other. The partition wall 400 may be located in the light blocking region BA.

A first capping layer 391 covering the first color filter 231, the second color filter 232 and the third color filter 233 may be disposed on one surface of the second base substrate 310. The first capping layer 391 may be in direct contact with the first color filter 231, the second color filter 232 and the third color filter 233.

The first capping layer 391 may prevent contamination or damage of the first color filter 231, the second color filter 232, the third color filter 233 and the like due to infiltration of impurities such as moisture or air from the outside. The first capping layer 391 may prevent the colorant included in the first color filter 231, the second color filter 232 and the third color filter 233 from being diffused into other components, e.g., the first wavelength conversion pattern 330 and the second wavelength conversion pattern 340. The first capping layer 391 may be made of an inorganic material. For example, the first capping layer 391 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or the like.

The first capping layer 391 may also be in contact with the partition wall 400. The first capping layer 391 may be in contact with the partition wall 400 at least in the light blocking region BA. The partition wall 400 may be disposed between the first color filter 231, the second color filter 232 and the third color filter 233, and the first capping layer 391 may be in contact with the partition wall 400 between the first color filter 231, the second color filter 232 and the third color filter 233. The first capping layer 391 may be in contact with the partition wall 400 in the light transmitting region TA.

The partition wall 400 may be disposed on one surface of the second base substrate 310 facing the display substrate 10. The partition wall 400 may be disposed to overlap or face the light blocking region BA. As illustrated in FIG. 9, the partition wall 400 may extend in the first direction DR1 and the second direction DR2 in the light blocking region BA. The partition wall 400 may extend in the second direction DR2 in the first light blocking region BA1, the second light blocking region BA2 and the third light blocking region BA3. The partition walls 400 extending in the second direction DR2 in the first light blocking region BA1, the second light blocking region BA2 and the third light blocking region BA3 may extend to the fourth light blocking region BA4, the fifth light blocking region BA5 and the sixth light blocking region BA6, respectively. Further, the partition wall 400 may extend in the first direction DR1 in the seventh light blocking region BA7. For example, the partition wall 400 may be formed in a grid pattern on the second base substrate 310 between ones of the light blocking regions.

According to an embodiment, at least a partial region of the partition wall 400 may overlap or face a light transmitting region TA. Both sides of the partition wall 400 extending in the second direction DR2 may overlap or face the light transmitting region TA. For example, the width of the partition wall 400 may be larger than the width of the light blocking region BA. For example, one side of the partition wall 400 located in the first light blocking region BA1 may overlap or face the first light transmitting region TA1, and the other side thereof may overlap or face the second light transmitting region TA2. The partition wall 400 extending in the first direction DR1 in the seventh light blocking region TA7 may have one side overlapping with or facing the first light transmitting region TA1, and the other side overlapping with or facing the fourth light transmitting region TA4. The partition wall 400 may be formed as described above by arranging partition layers 410 and 420 so as to allow the partition wall 400 to partially overlap or face the color filters.

The partition wall 400 may include an organic light blocking material, and may be formed through a coating and exposure process for an organic light blocking material. It may be the case that without the partition wall 400, external light directed toward the display device 1 may cause a problem such as a distortion of the color reproducibility of the color conversion substrate 30. The partition wall 400 located on the second base substrate 310 may absorb at least a portion of such external light. Accordingly, the partition wall 400 may reduce color distortion due to external light reflection. The partition wall 400 may prevent light interference between adjacent light transmitting regions, which causes color mixture, thereby improving color reproducibility.

The partition wall 400 may be located in a portion of the light blocking region BA and may overlap or face the non-emission region NLA. The partition wall 400 may be disposed to surround or be around each of the first light transmitting region TA1, the second light transmitting region TA2, the third light transmitting region TA3, the fourth light transmitting region TA4, the fifth light transmitting region TA5 and the sixth light transmitting region TA6. The partition wall 400 may have a grid shape in plan view so as to be around the light transmitting regions TA.

According to an embodiment, the first wavelength conversion pattern 330, the second wavelength conversion pattern 340 and the light transmission pattern 350 may be formed by an inkjet method using an ink composition. The partition wall 400 formed on the color conversion substrate 30 may serve as a guide for stably positioning, at a desired position, the ink composition for forming the first wavelength conversion pattern 330, the second wavelength conversion pattern 340 and the light transmission pattern 350.

The partition wall 400 may be made of an organic material, and may be made of a photosensitive organic material. The photosensitive organic material may be a negative photosensitive material which may be cured relative a portion thereof to which light may be irradiated. The partition wall 400 may include the light blocking member 190. For example, the partition wall 400 may be located in the light blocking region BA to block light transmission. The partition wall 400 may be located between the first wavelength conversion pattern 330 and the second wavelength conversion pattern 340 and between the second wavelength conversion pattern 340 and the light transmission pattern 350. The partition wall 400 may prevent color mixture between different light transmitting regions located adjacent to each other. In other words, the partition wall 400 may overlap or face the light blocking region BA, thereby preventing color mixture between neighboring light transmitting regions, and also preventing the ink from overflowing into the neighboring light transmitting region during a process of forming the first wavelength conversion pattern 330, the second wavelength conversion pattern 340 and the light transmission pattern 350.

The partition wall 400 according to an embodiment may be formed as a double layer including a first partition layer 410 and a second partition layer 420. The first wavelength conversion pattern 330, the second wavelength conversion pattern 340 and the light transmission pattern 350 may be formed to have a predetermined thickness, and the height of the partition wall 400 may be greater than the respective heights of at least the first wavelength conversion pattern 330, the second wavelength conversion pattern 340 and the light transmission pattern 350. The first partition layer 410 of the partition wall 400 may be disposed between the color filters that may be spaced apart from each other. The first partition layer 410 according to an embodiment may be disposed on the color filters that may be spaced apart from each other to form a flat lower surface. Accordingly, the partition wall 400 may have a symmetrical configuration between the neighboring light transmitting regions TA.

The first wavelength conversion pattern 330, the second wavelength conversion pattern 340 and the light transmission pattern 350 may be disposed on the first capping layer 391. The light transmission pattern 350, the first wavelength conversion pattern 330 and the second wavelength conversion pattern 340 may be formed by an inkjet method. However, the disclosure may not be limited thereto, and the light transmission pattern 350, the first wavelength conversion pattern 330 and the second wavelength conversion pattern 340 may be formed by coating a photosensitive material, and exposing and developing the photosensitive material. Hereinafter, a case where the light transmission pattern 350, the first wavelength conversion pattern 330 and the second wavelength conversion pattern 340 may be formed by an inkjet method will be described by way of example.

The first wavelength conversion pattern 330 may be located on the first capping layer 391, and may be located in the first light transmitting region TA1 and the fourth light transmitting region TA4. In some embodiments, the first wavelength conversion pattern 330 may have a structure in which a portion located in the first light transmitting region TA1 and a portion located in the fourth light transmitting region TA4 are separated from each other, i.e., in an island pattern form.

The first wavelength conversion pattern 330 may emit light by converting or shifting the peak wavelength of incident light to another specific peak wavelength. The first wavelength conversion pattern 330 may convert the emission light L provided from the first light emitting element ED1 into red light having a peak wavelength in a range of about 610 nm to about 650 nm and emit the red light.

The first wavelength conversion pattern 330 may include a first base resin 331 and a first wavelength conversion material 335 dispersed in the first base resin 331, and may include a first scatterer 333 dispersed in the first base resin 331. The first base resin 331 may be made of a material having high light transmittance. The first base resin 331 may be formed of an organic material. The first base resin 331 may include an organic material such as epoxy resin, acrylic resin, cardo resin, or imide resin. However, the disclosure may not be limited thereto.

The first wavelength conversion material 335 may convert or shift the peak wavelength of incident light to another specific peak wavelength. The first wavelength conversion material 335 may convert the emission light L, which may be blue light provided from the first light emitting element ED1, into red light having a single peak wavelength in a range of about 610 nm to about 650 nm and emit the red light.

The first wavelength conversion material 335 may include a quantum dot, a quantum rod, a phosphor, and the like. For example, a quantum dot may be a particulate material that may emit light of a specific color in a case that an electron transitions from a conduction band to a valence band.

The quantum dot may be a semiconductor nanocrystal material. The quantum dot may have a specific band gap according to its composition and size. Thus, the quantum dot may absorb light and then emit light having an intrinsic wavelength. Examples of semiconductor nanocrystals of the quantum dot may include group IV nanocrystals, group II-VI compound nanocrystals, group III-V compound nanocrystals, group IV-VI nanocrystals, and combinations thereof.

The group II-VI compound may be selected from the group consisting of binary compounds, ternary compounds, and quaternary compounds, wherein the binary compounds are selected from the group consisting of CdSe, CdTe, ZnS, ZnSe, ZnTe, ZnO, HgS, HgSe, HgTe, MgSe, MgS and mixtures thereof. The ternary compounds may be selected from the group consisting of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures thereof. The quaternary compounds may be selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe and mixtures thereof.

The group III-V compound may be selected from the group consisting of binary compounds, ternary compounds, and quaternary compounds, wherein the binary compounds may be selected from the group consisting of GaN, GaP, GaAs, GaSb, AlN, AlP, AlAs, AlSb, InN, InP, InAs, InSb and mixtures thereof. The ternary compounds may be selected from the group consisting of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP and mixtures thereof. The quaternary compounds may be selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof.

The group IV-VI compound may be selected from the group consisting of binary compounds, ternary compounds, and quaternary compounds, wherein the binary compounds may be selected from the group consisting of SnS, SnSe, SnTe, PbS, PbSe, PbTe and mixtures thereof. The ternary compounds may be selected from the group consisting of SnSeS, SnSeTe, SnSTe, PbSeS, PbSeTe, PbSTe, PbSnS, SnPbSe, SnPbTe and mixtures thereof. The quaternary compounds may be selected from the group consisting of SnPbSSe, SnPbSeTe, SnPbSTe and mixtures thereof. The group IV element may be selected from the group consisting of Si, Ge and mixtures thereof. The group IV compound may be a binary compound selected from the group consisting of SiC, SiGe and mixtures thereof.

The binary compound, the tertiary compound or the quaternary compound may exist in particles at a uniform concentration, or may exist in the same particle divided into states where concentration distributions may be partially different. The particles may have a core/shell structure in which one quantum dot may surround or be around another quantum dot. An interface between the core and the shell may have a concentration gradient in which the concentration of elements existing in the shell may decrease toward the center.

The quantum dot may have a core-shell structure including a core containing the nanocrystal described above and a shell surrounding or around the core. The shell of the quantum dot may serve as a protective layer for maintaining semiconductor characteristics by preventing chemical denaturation of the core and/or as a charging layer for giving electrophoretic characteristics to the quantum dot. The shell may include a single layer or a multilayer configuration. An interface between the core and the shell may have a concentration gradient in which the concentration of elements existent in the shell may decrease toward the center. Examples of the shell of the quantum dot may include a metal or non-metal oxide, a semiconductor compound, and a combination thereof.

For example, the metal or non-metal oxide may be a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$ and $NiO$, or a tertiary compound such as $MgAl_2O_4$, $CoFe_2O_4$, $NiFe_2O_4$ and $CoMn_2O_4$, though the disclosure may not be limited thereto.

The semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb or the like, though the disclosure may not be limited thereto.

The light emitted from the first wavelength conversion material 335 may have a full width of half maximum (FWHM) of an emission wavelength spectrum of less than or equal to about 45 nm, less than or equal to about 40 nm, or less than or equal to about 30 nm. Thus, the purity and reproducibility of a color displayed by the display device 1 may be improved. Light emitted from the first wavelength conversion material 335 may be emitted in various directions regardless of the incident direction of incident light. Accordingly, it may be possible to improve the lateral visibility of the red light displayed in the first light transmitting region TA1.

A portion of the emission light L provided from the first light emitting element ED1 may be transmitted and emitted through the first wavelength conversion pattern 330 without being converted into red light by the first wavelength conversion material 335. The component of the emission light L incident on the first color filter 231 that may not be converted by the first wavelength conversion pattern 330 may be blocked by the first color filter 231. On the other hand, the red light of the emission light L converted by the first wavelength conversion pattern 330 may pass through the first color filter 231 and may be emitted to the outside. For example, the light that may be converted by the first wavelength conversion pattern 330 may be emitted from the first light transmitting region TA1 as red light.

The first scatterer 333 may have a refractive index different from that of the first base resin 331 and may form an optical interface with the first base resin 331. For example, the first scatterer 333 may include light scattering particles. The first scatterer 333 may not be limited in form as long as it may be a material capable of scattering at least a portion of the transmitted light. For example, the first scatterer 333 may include metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include acrylic resin and urethane resin, and the like. The first scatterer 333 may scatter the light in a random direction regardless of the incident direction of the incident light without substantially converting the wavelength of the light passing through the first wavelength conversion pattern 330.

The second wavelength conversion pattern 340 may be located on the first capping layer 391, and may be located in the second light transmitting region TA2 and the fifth light transmitting region TA5. The second wavelength conversion pattern 340 may include a portion located in the second light transmitting region TA2 and a portion located in the fifth light transmitting region TA5 which may be separated from each other, i.e., in an island pattern.

The second wavelength conversion pattern 340 may emit light by converting or shifting the peak wavelength of incident light to another specific peak wavelength. The second wavelength conversion pattern 340 may convert the emission light L provided from the second light emitting element ED2 into green light having a peak wavelength in a range of about 510 nm to about 550 nm and may emit the green light.

The second wavelength conversion pattern 340 may include a second base resin 341 and a second wavelength conversion material 345 dispersed in the second base resin 341, and may include a second scatterer 343 dispersed in the second base resin 341.

The second base resin 341 may be made of a material having high light transmittance. The second base resin 341 may include an organic material. The second base resin 341 may be made of the same material as the first base resin 331, or may include at least one of the materials that may form the first base resin 331. However, the disclosure may not be limited thereto.

The second wavelength conversion material 345 may convert or shift the peak wavelength of incident light to another specific peak wavelength. The second wavelength conversion material 345 may convert the emission light L having a peak wavelength in a range of about 440 nm to about 480 nm into green light having a peak wavelength in a range of about 510 nm to about 550 nm.

Examples of the second wavelength conversion material 345 may include a quantum dot, a quantum rod, a phosphor, and the like. The second wavelength conversion material 345 may be substantially the same as or similar to the first wavelength conversion material 335.

Both the first wavelength conversion material 335 and the second wavelength conversion material 345 may be formed of quantum dots. The particle size of the quantum dots forming the first wavelength conversion material 335 may be larger than the particle size of the quantum dots forming the second wavelength conversion material 345.

The second scatterer 343 may have a refractive index different from that of the second base resin 341 and may form an optical interface with the second base resin 341. For example, the second scatterer 343 may include light scattering particles. The second scatterer 343 may be substantially the same as or similar to the first scatterer 333.

The emission light L emitted from the second light emitting element ED2 may be provided to the second wavelength conversion pattern 340, and the second wavelength conversion material 345 may convert the emission light L emitted from the second light emitting element ED2 into green light having a peak wavelength in a range of about 510 nm to about 550 nm and may emit the green light.

The light transmission pattern 350 may be located on the first capping layer 391, and may be located in the third light transmitting region TA3 and the sixth light transmitting region TA6. The light transmission pattern 350 may include a portion located in the third light transmitting region TA3 and a portion located in the sixth light transmitting region TA6 that may be separated from each other, i.e., in an island pattern.

The light transmission pattern 350 may transmit incident light. The emission light L provided from the third light emitting element ED3 may pass through the light transmission pattern 350 and the third color filter 233 and may be emitted to the outside of the display device 1. For example, the light emitted from the third light transmitting region TA3 may be blue light.

The light transmission pattern 350 may include a third base resin 351, and a third scatterer 353 dispersed in the third base resin 351.

The third base resin 351 may be made of a material having high light transmittance. The third base resin 351 may include an organic material. For example, the third base resin 351 may be made of the same material as the first base resin 331, or may include at least one of the materials forming the first base resin 331. However, the disclosure may not be limited thereto.

The third scatterer 353 may have a refractive index different from that of the third base resin 351 and may form an optical interface with the third base resin 351. For example, the third scatterer 353 may include light scattering particles. The third scatterer 353 may be substantially the same as or similar to the first scatterer 333.

A second capping layer (not shown) may be located on the light transmission pattern 350, the first wavelength conversion pattern 330 and the second wavelength conversion pattern 340. The second capping layer may cover the light transmission pattern 350, the first wavelength conversion pattern 330, the second wavelength conversion pattern 340 and the partition wall 400, and may seal them. Accordingly, the second capping layer may prevent contamination or damage of the light transmission pattern 350, the first wavelength conversion pattern 330 and the second wavelength conversion pattern 340 due to infiltration of impurities such as moisture or air from the outside. The second capping layer may be made of an inorganic material. The second capping layer may be made of the same material as the first capping layer 391, or may include at least one of the materials included in the first capping layer 391.

As described above, the filler 70 may be located in the space between the color conversion substrate 30 and the display substrate 10. The filler 70 may be located between the first capping layer 391 and the thin film encapsulation layer 170. The filler 70 may be in direct contact with first capping layer 391.

Figure 14:
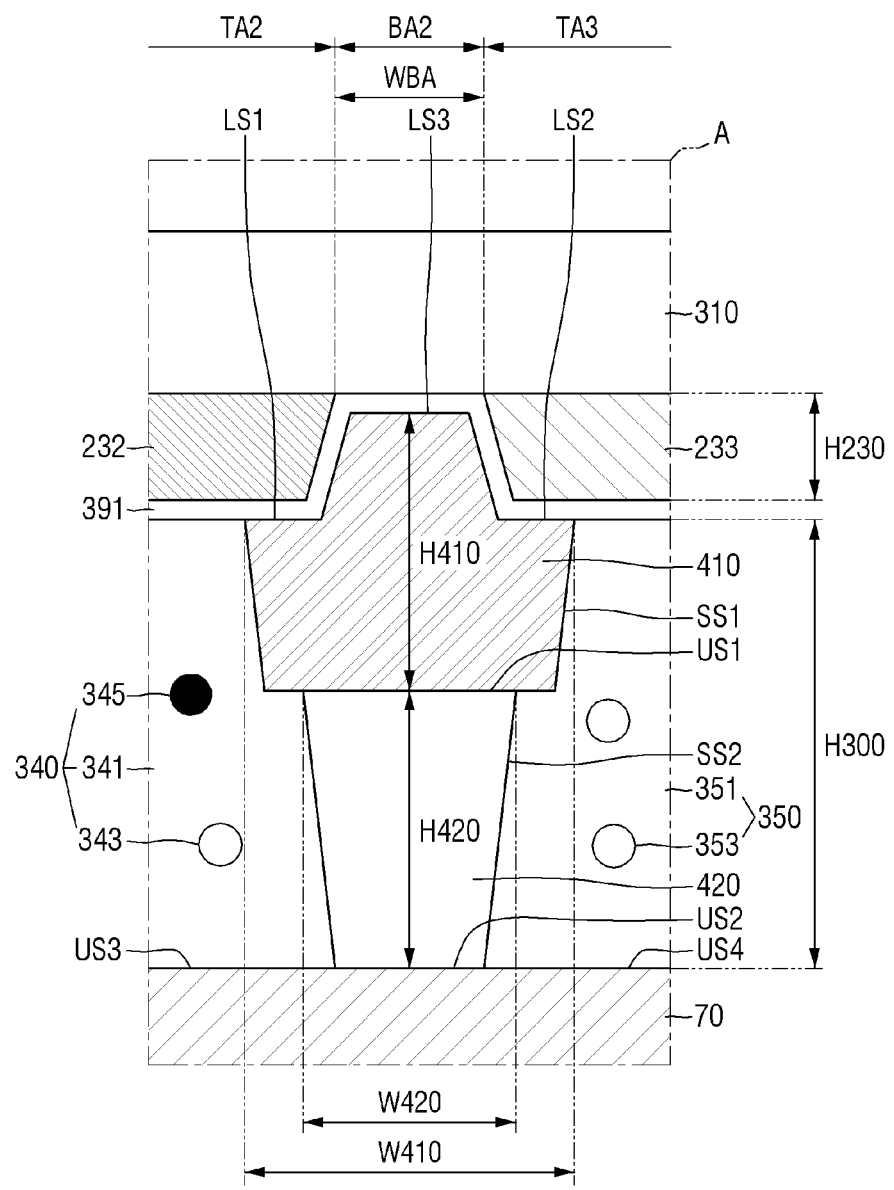
FIG. 14 shows an enlarged view of portion A of FIG. 5.

FIG. 14 shows an enlarged view of portion A of FIG. 5 as a partially enlarged schematic cross-sectional view of the second light blocking region BA2 between the second light transmitting region TA2 and the third light transmitting region TA3. The description of FIG. 14 may be equally applied to the partition walls 400 located in the others of the light transmitting regions TA and the light blocking regions BA.

As illustrated in FIG. 14, the partition wall 400 according to an embodiment may include the first partition layer 410 and the second partition layer 420. The first partition layer 410 may be disposed on one surface of the second base substrate 310. The second color filter 232 and the third color filter 233 may be spaced apart from each other, and the second light blocking region BA2 may be located in the separation region therebetween. According to an embodiment, the first partition layer 410 may be disposed between the second color filter 232 and the third color filter 233. At least a portion of the first partition layer 410 may be disposed to overlap or face the second color filter 232 and the third color filter 233, and at least a portion of the first partition layer 410 may be disposed on one surface of the second base substrate 310 without overlapping or facing the color filters.

The lower surface of the first partition layer 410 may include a first lower surface LS1 disposed on the second color filter 232, a second lower surface LS2 disposed on the third color filter 233, and a third lower surface LS3 disposed on one surface of the second base substrate 310. Since the color filters 232 and 233 may be spaced apart from each other and the first partition layer 410 may be disposed therebetween, the lower surfaces LS1 and LS2 of the first partition wall layer 410 may be respectively disposed on the second color filter 232 and the third color filter 233. The first partition layer 410 may include an organic light blocking material, and may be formed through a coating and exposure process for an organic light blocking material. During the coating and exposure process of the organic light blocking material, the shape of the side surface SS1 or upper surface US1 of the first partition layer 410 may be changed according to the shape of the lower surface on which the organic light blocking material may be disposed, and thus the first partition layer 410 may have an asymmetric structure. As a result of the formation of the first partition layer 410, the volumes of the second wavelength conversion pattern 340 disposed on the second color filter 232 and the light transmission pattern 350 disposed on the third color filter 233 may be different.

In a manufacturing process of the color conversion substrate 30, the first wavelength conversion pattern 330, the second wavelength conversion pattern 340 and the light transmission pattern 350 may be formed in regions that may be partitioned by the partition wall 400. According to the volume or height H300 of the first wavelength conversion pattern 330, the second wavelength conversion pattern 340 and the light transmission pattern 350, an amount of light emitted to the first color filter 231, the second color filter 232 and the third color filter 233 may vary. For example, it may be required to form the first wavelength conversion pattern 330, the second wavelength conversion pattern 340 and the light transmission pattern 350 with a uniform height and volume in the color conversion substrate 30 in order to provide a uniformly emitted amount and quality of light from each of the first color filter 231, the second color filter 232 and the third color filter 233.

The volume of the region where the first wavelength conversion pattern 330, the second wavelength conversion pattern 340 and the light transmission pattern 350 may be formed may vary depending on the shape of the partition wall 400. In a case that the partition wall 400 formed on the color conversion substrate 30 may have a different size or shape for each light blocking region BA, the first wavelength conversion pattern 330, the second wavelength conversion pattern 340 and the light transmission pattern 350 may be formed to have a different volume in the light blocking region BA and neighboring light transmitting regions TA. Accordingly, a different amount of light may be emitted for each light transmitting region TA through which light of the same color may be transmitted. Furthermore, in a case that such different volumes may exist, the amount or color purity of light emitted from the second color filter 232 and the third color filter 233 through the second wavelength conversion pattern 340 and the light transmission pattern 350 may be different, which may reduce the color reproducibility of the display device 1.

In the color conversion substrate 30 according to an embodiment, however, in order that the first partition layer 410 may have a symmetrical shape to avoid the above disadvantages, the color filters 232 and 233 may be spaced apart from each other such that the lower surface of the first partition layer 410 forms a flat surface. For example, the first lower surface LS1 and the second lower surface LS2 of the first partition layer 410 may form a flat surface on the second color filter 232 and the third color filter 233, respectively. The third lower surface LS3 of the first partition layer 410 may also form a flat surface on one surface of the second base substrate 310. The first lower surface LS1 and the second lower surface LS2 of the first partition layer 410 may be parallel to one surface of the second base substrate 310.

The first partition layer 410 may include the first lower surface LS1, the second lower surface LS2 and the third lower surface LS3. The first lower surface LS1 may be disposed on one color filter, i.e., the second color filter 232. The second lower surface LS2 may be disposed on another color filter, i.e., the third color filter 233. The third lower surface LS3 may be disposed on one surface of the second base substrate 310, wherein such surface may be a region where the second color filter 232 and the third color filter 233 may be spaced apart from each other. The first lower surface LS1, the second lower surface LS2 and the third lower surface LS3 may be substantially disposed on the first capping layer 391. In other words, the first lower surface LS1, the second lower surface LS2 and the third lower surface LS3 may each contact the first capping layer 391 while the first lower surface LS1 and the second lower surface LS2 may be parallel to the second base substrate 310. With this configuration, the width of the first partition layer 410 may flare, i.e., increase in width, from the third lower surface LS3 toward ends of the first lower surface LS1 and the second lower surface LS2 that may contact the first capping layer 391. The aforementioned flare may establish a neck of the first partition layer 410 between the third lower surface LS3 and shoulders of the first partition layer 410 defined at each of the first lower surface LS1 and the second lower surface LS2. Thus, the aforementioned neck and shoulder configuration may provide the symmetrical configuration of the partition wall 400 so as to enable desired color reproducibility of the color substrate.

Accordingly, the first partition layer 410 may have a symmetrical structure with respect to the third lower surface LS3, and may have a uniform shape on the entire surface of the color conversion substrate 30.

According to an embodiment, a width W410 of the first partition layer 410 may be greater than a width WBA of a region where the color filters are spaced apart from each other. The first partition layer 410 may have a width of a predetermined amount or more such that the first partition layer 410 may be disposed on one color filter, another color filter and the separation region therebetween. Since the width W410 of the first partition layer 410 may be larger than the width WBA of the region where the color filters are spaced apart from each other, the first partition layer 410 may include the first lower surface LS1 and the second lower surface LS2 disposed to overlap only one color filter at each respective surface, and may be formed to include a flat surface with the first capping layer 391. The width W410 of the first partition layer 410 may not be particularly limited. For example, it may vary depending on the number of the transmitting regions TA defined in the color conversion substrate 30. The width W410 of the first partition layer 410 may have a range of about 15 μm to about 55 μm.

According to an embodiment, a height H410 of the first partition layer 410 may be greater than a thickness H230 of any of the color filters. Accordingly, at least a portion of a respective color filter may be disposed between one surface of the second base substrate 310 and the first partition wall layer 410. Since the first partition layer 410 may be disposed in the region where the color filters are spaced apart from each other while the height H410 may be greater than the thickness H230 of a respective color filter or color filters and the width W410 may be larger than the width WBA of the region where the color filters are spaced apart from each other, the partition wall 400 may include the first lower surface LS1 and the second lower surface LS2.

The second partition layer 420 may be disposed on an upper surface US1 of the first partition layer 410. The partition wall 400 may be integrally formed to include the second partition layer 420 and the first partition layer 410. The second partition layer 420 may substantially determine the height of the partition wall 400. The sum of the height H420 of the second partition layer 420 and the height H410 of the first partition layer 410 may be greater than the sum of the thickness H230 of a respective color filter and the height H300 of the first wavelength conversion pattern 330, the second wavelength conversion pattern 340 and the light transmission pattern 350. In other words, the upper surface US1 of the first partition layer 410 may be higher than upper surfaces of at least the first wavelength conversion pattern 330, the second wavelength conversion pattern 340, e.g., US3, and the light transmission pattern 350, e.g., US4, respectively. Although that the upper surface US2 of the second partition layer 420 may be flush with the upper surfaces of the first wavelength conversion pattern 330, the second wavelength conversion pattern 340 and the light transmission pattern 350, the disclosure may not be limited thereto. As described above, the amount of light emitted from the color conversion substrate 30 may vary depending on the volume of the first wavelength conversion pattern 330, the second wavelength conversion pattern 340 and the light transmission pattern 350. Accordingly, the regions partitioned by the partition wall 400 may be required to have a specific volume so as to have a light amount required for light to be emitted from the color conversion substrate 30. This volume be adjusted by adjusting the height of the partition wall 400, i.e., the height H420 of the second partition layer 420. In some embodiments, the height H410 of the first partition layer 410 may be the same as the height H420 of the second partition layer 420.

According to an embodiment, the width W420 of the second partition layer 420 may be smaller than the width W410 of the first partition layer 410, and larger than the width WBA of the region where the color filters may be spaced apart from each other. The second partition layer 420 may be formed directly on the first partition layer 410. In a case that the width W420 of the second partition layer 420 may be larger than the width W410 of the first partition layer 410, the second partition layer 420 may be non-uniformly formed on the color conversion substrate 30.

According to an embodiment, the second partition layer 420 may include the width W420 to be smaller than the width W410 of the first partition layer 410 so as to be formed on the flat upper surface US1 of the first partition layer 410. Accordingly, the side surface SS2 of the second partition layer 420 may be recessed toward the center of the partition wall 400 from the side surface SS1 of the first partition layer 410. The side surface of the partition wall 400, i.e., SS1 and SS2, may have a shape in which at least a portion thereof is recessed.

The width of the second partition layer 420 may be larger than the width WBA of the region where the color filters may be spaced apart from each other. A portion of the light emitted from the display substrate 10 and incident on the first wavelength conversion pattern 330, the second wavelength conversion pattern 340 and the light transmission pattern 350 may be incident on the color filters, but at least a portion thereof may be incident on the partition wall 400. The partition wall 400 may block the light incident from the first wavelength conversion pattern 330, the second wavelength conversion pattern 340 and the light transmission pattern 350 from moving to a first wavelength conversion pattern 330, a second wavelength conversion pattern 340 and a light transmission pattern 350 located in another neighboring light transmitting region TA. To this end, the partition wall 400 may be required to have a minimum thickness, and the second partition layer 420 may have the width W420 that may be larger than that of the light blocking region BA or the width WBA of the region where the color filters are spaced apart from each other. However, the disclosure may not be limited thereto.

FIGS. 15 to 19 show schematic cross-sectional views illustrating a part of a manufacturing process of a display device according to an embodiment.

FIGS. 15 to 19 schematically illustrate a manufacturing process of the color conversion substrate 30 of the display device 1. In the following description, a discussion of the first light transmitting region TA1, the second light transmitting region TA2 and the third light transmitting region TA3 follows. However, it will be obvious that the following description may also be similarly applied to other light transmitting regions TA, e.g., the fourth light transmitting region TA4, the fifth light transmitting region TA5 and the sixth light transmitting region TA6.

Figure 15:
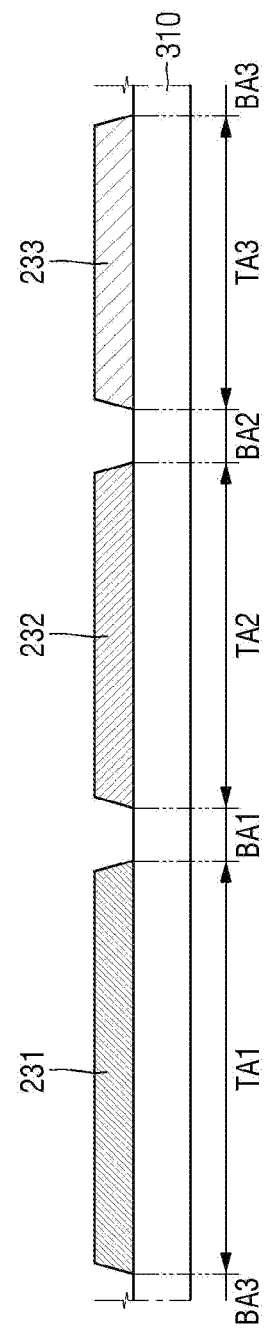
FIG. 15 to FIG. 19 show schematic cross-sectional views illustrating a part of a manufacturing process of a display device according to an embodiment.

Referring to FIGS. 15 to 19, and as shown in FIG. 15, a color filter 230 may be formed on one surface of the second base substrate 310. The color filter 230 may be formed in a region overlapping or facing each light transmitting region TA. The color filters 231, 232, and 233 may be formed by coating a photosensitive organic material containing a colorant of a specific color, and exposing and developing the photosensitive organic material. For example, the first color filter 231 may be formed by coating a photosensitive organic material containing a red colorant, and exposing and developing it, the second color filter 232 may be formed by coating a photosensitive organic material containing a green colorant, and exposing and developing it, and the third color filter 233 may be formed by coating a photosensitive organic material containing a blue colorant, and exposing and developing it. According to an embodiment, the first color filter 231, the second color filter 232, and the third color filter 233 may be spaced apart from each other. However, the disclosure may not be limited thereto, and in some cases, such color filters may be disposed to overlap each other.

Figure 16:
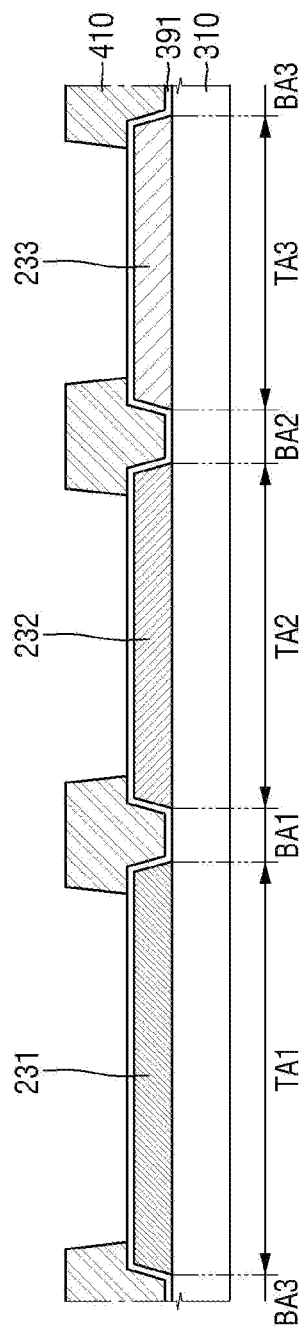

As shown in FIG. 16, the first capping layer 391 covering the first color filter 231, the second color filter 232 and the third color filter 233 may be formed, and the first partition layer 410 may be formed between the color filters 231, 232, and 233 which may be spaced apart from each other. At least a portion of the first partition layer 410, including sides thereof, may be disposed on the color filters 231, 232, and 233, respectively. The first width W410 of the first partition layer 410 may be larger than the width of the separation region between the plurality of color filters. The height H410 of the first partition layer 410 may be greater than the thickness H230 of the of color filters 231, 232, and 233.

Figure 17:
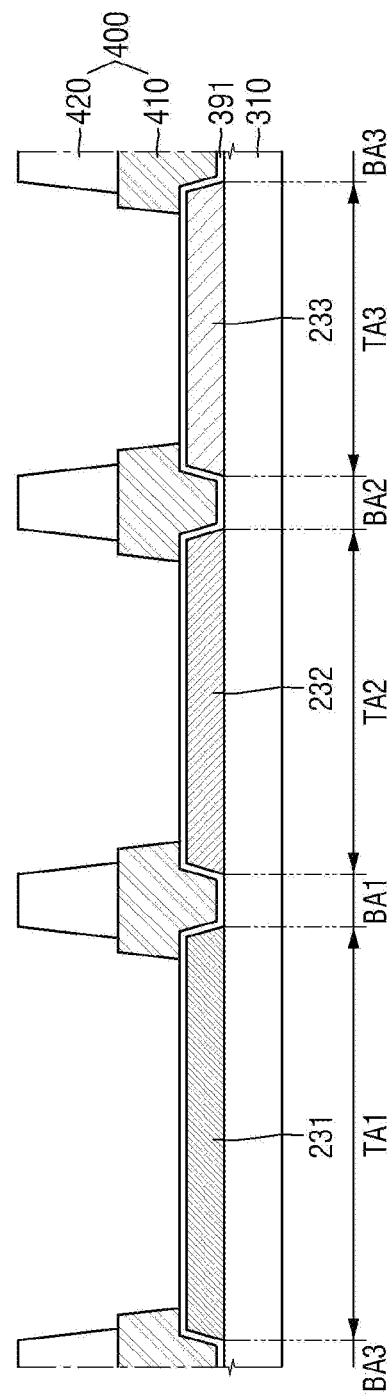

As shown in FIG. 17, the second partition layer 420 may be formed on the first partition layer 410. The first partition layer 410 and the second partition layer 420 may form the partition wall 400.

Figure 18:
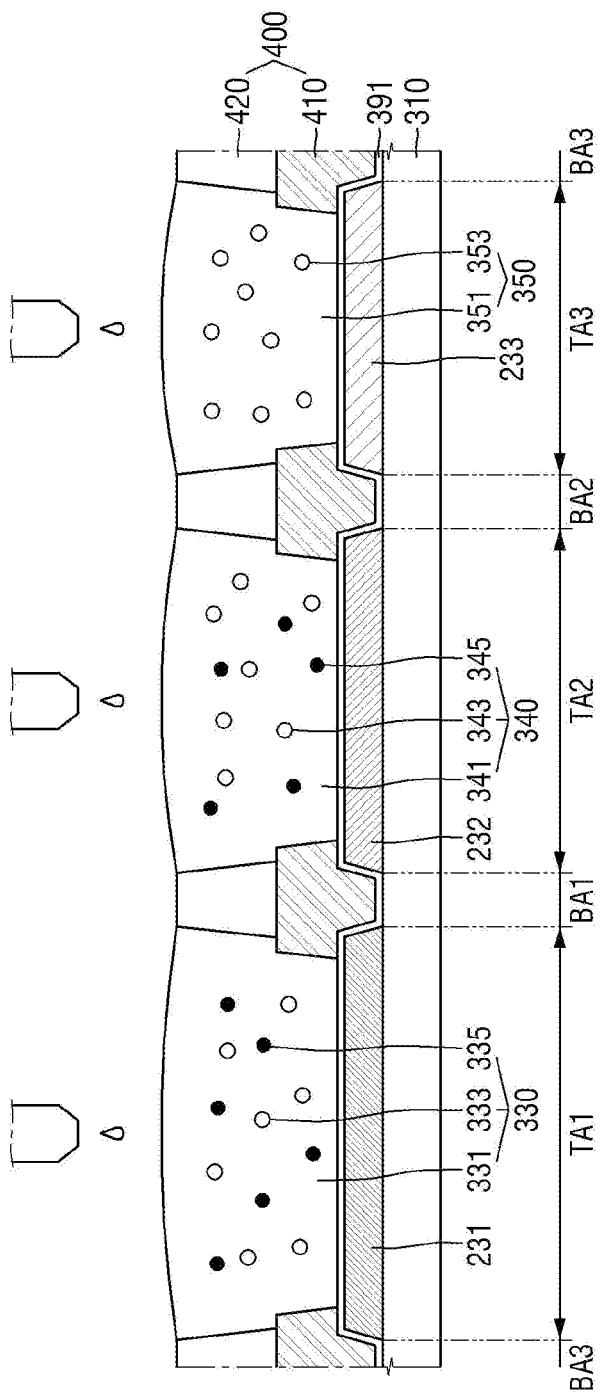

As shown in FIG. 18, the first wavelength conversion pattern 330, the second wavelength conversion pattern 340 and the light transmission pattern 350 may be formed by spraying ink onto the first light transmitting region TA1, the second light transmitting region TA2 and the third light transmitting region TA3, respectively. Each of the first wavelength conversion pattern 330, the second wavelength conversion pattern 340 and the light transmission pattern 350 may be formed in a region surrounded by or disposed around the partition wall 400.

Figure 19:
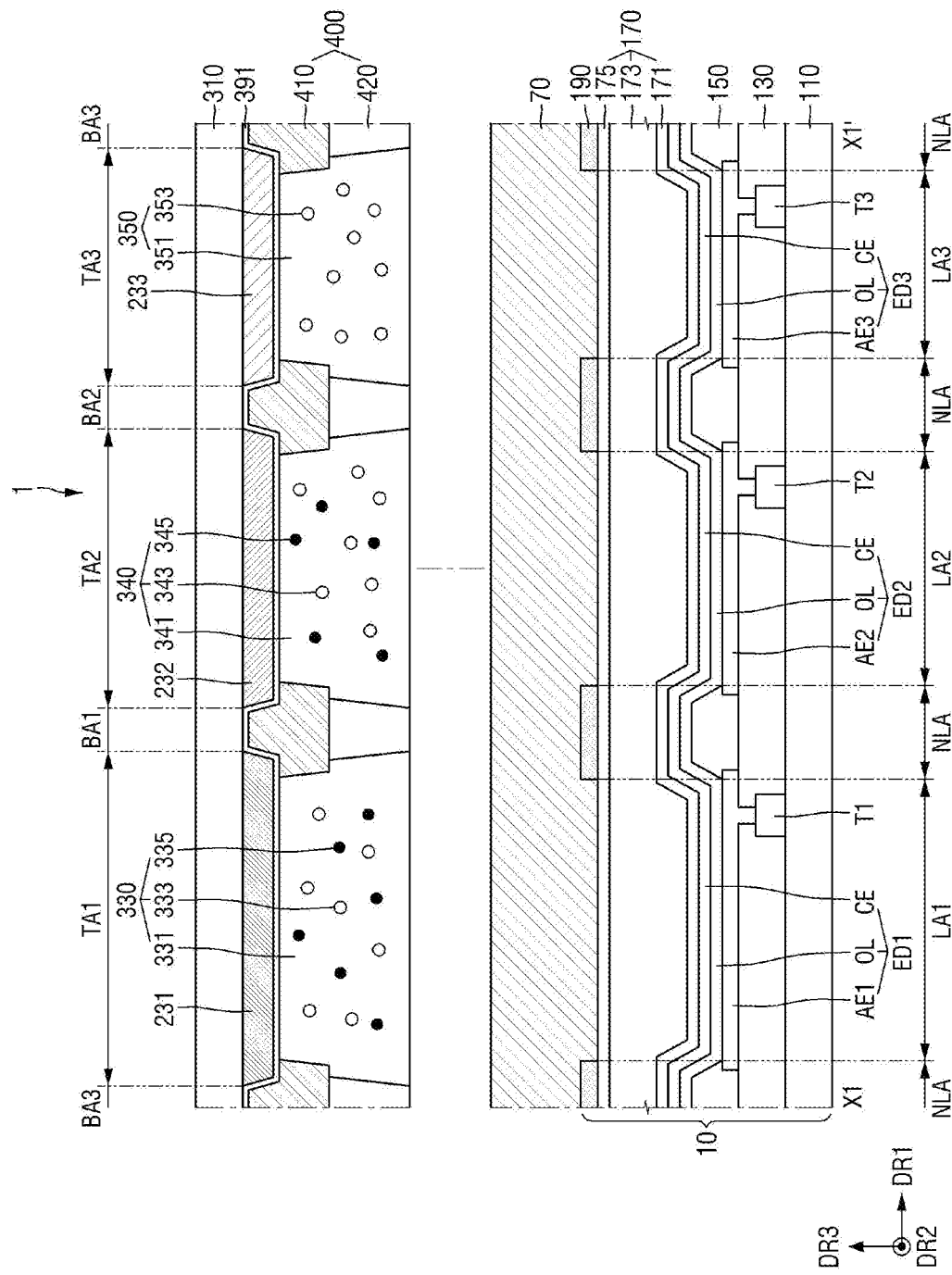

As shown in FIG. 19, the display device 1 may be manufactured by bonding the display substrate 10 and the color conversion substrate 30 to each other, with the filler 70 therebetween.

FIGS. 20 to 24 show schematic cross-sectional views of a display device according to embodiments.

Figure 20:
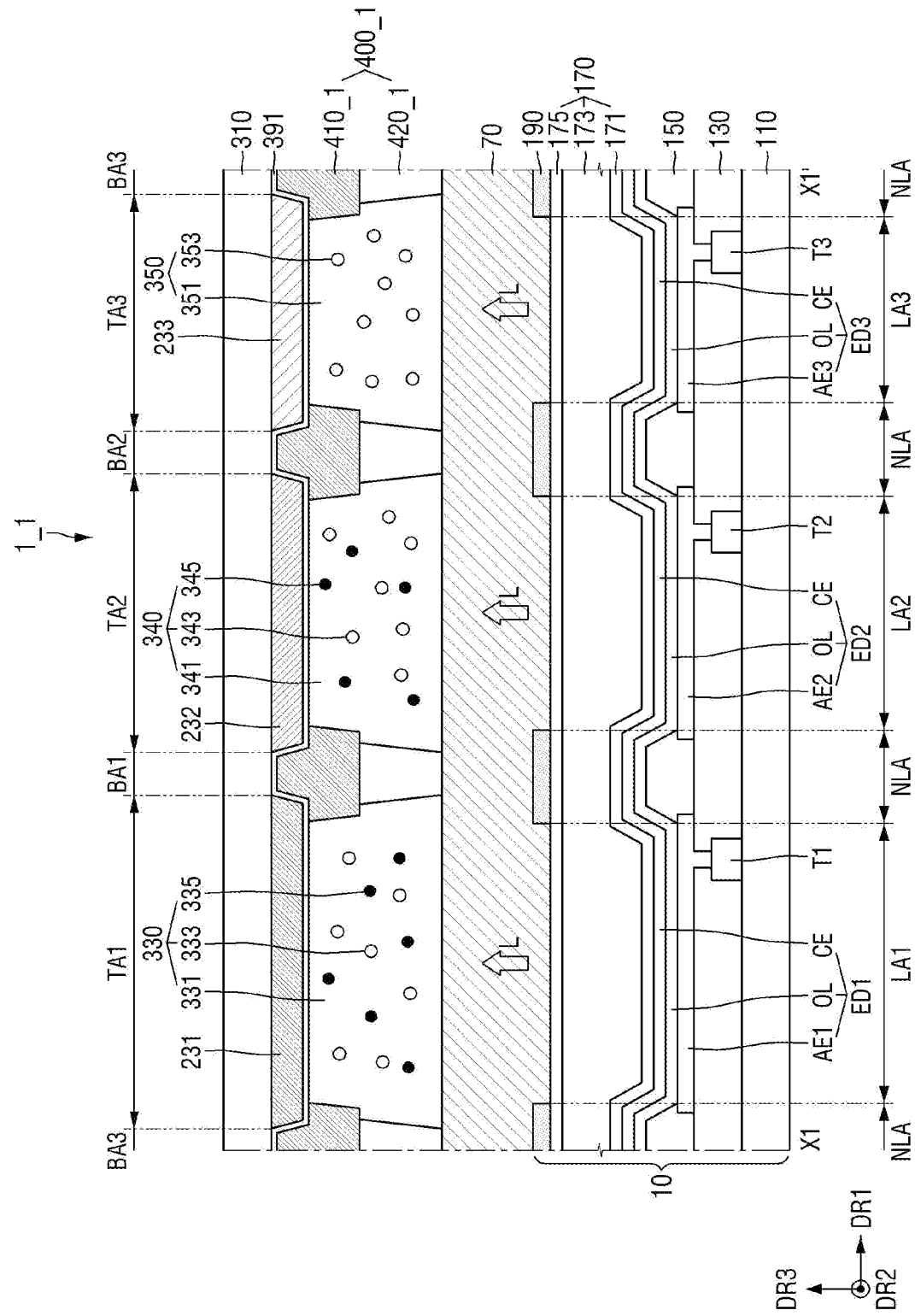
FIG. 20 to FIG. 24 show schematic cross-sectional views of a display device according to other embodiments.

Referring to FIG. 20, a first partition layer 410_1 of a color conversion substrate 30_1 according to an embodiment may include substantially the same material as the first color filter 231. The color conversion substrate 30_1 according to the embodiment differs from the color conversion substrate 30 of FIG. 5 in that the first partition layer 410_1 of a partition wall 400_1 includes a different material than does the first partition layer 400.

In the color conversion substrate 30_1 of FIG. 20, the first partition layer 410_1 may include the same colorant as the first color filter 231. For example, the first partition layer 410_1 may include a red pigment or colorant. The emission light L emitted from the display substrate 10 may be incident on the first wavelength conversion pattern 330, the second wavelength conversion pattern 340 and the light transmission pattern 350. The emission light L incident on the first wavelength conversion pattern 330, the second wavelength conversion pattern 340 and the light transmission pattern 350 may be incident on the first color filter 231, the second color filter 232 and the third color filter 233, respectively, to be displayed outside the display device 1. However, the emission light L may be blue light of a third color, and at least a portion thereof may be incident on the first partition layer 410_1 instead of the first color filter 231, the second color filter 232 and the third color filter 233. The emission light L incident on the second wavelength conversion pattern 340 and the light transmission pattern 350 may be mixed light of green light and blue light, or blue light, respectively. In the color conversion substrate 30_1 according to the embodiment, the first partition layer 410_1 may include the same material as the first color filter 231, thereby blocking the blue light or the mixed light of green light and blue light of the second wavelength conversion pattern 340 and the light transmission pattern 350 from traveling to another neighboring light transmitting region TA.

In regard to the emission light L incident on the first wavelength conversion pattern 330, the light converted into the red light by the first wavelength conversion material 335 may pass through the first partition layer 410_1 including the same material as the first color filter 231 and travel to another neighboring light transmitting region TA. However, since the second wavelength conversion pattern 340 or the light transmission pattern 350 may be located in the transmitting region TA adjacent to the first wavelength conversion pattern 330, the red emission light which may travel to the light transmission pattern 350 may be blocked from traveling to the outside of the display device 1 by the third color filter 233. The red emission light which may travel to the second wavelength conversion pattern 340 may be blocked from traveling to the outside of the display device 1 by the second color filter 232. Since the second wavelength conversion material 345 may not convert red light into green light, it may thus be possible to block the red emission light from passing through the second color filter 232 and traveling to the outside of the display device 1. The color conversion substrate 30_1 according to the embodiment may be configured such that the first partition layer 410_1 may include a red pigment, thereby preventing light from leaking through a neighboring transmitting region TA due to the color filter thereat not including a red pigment.

Figure 21:
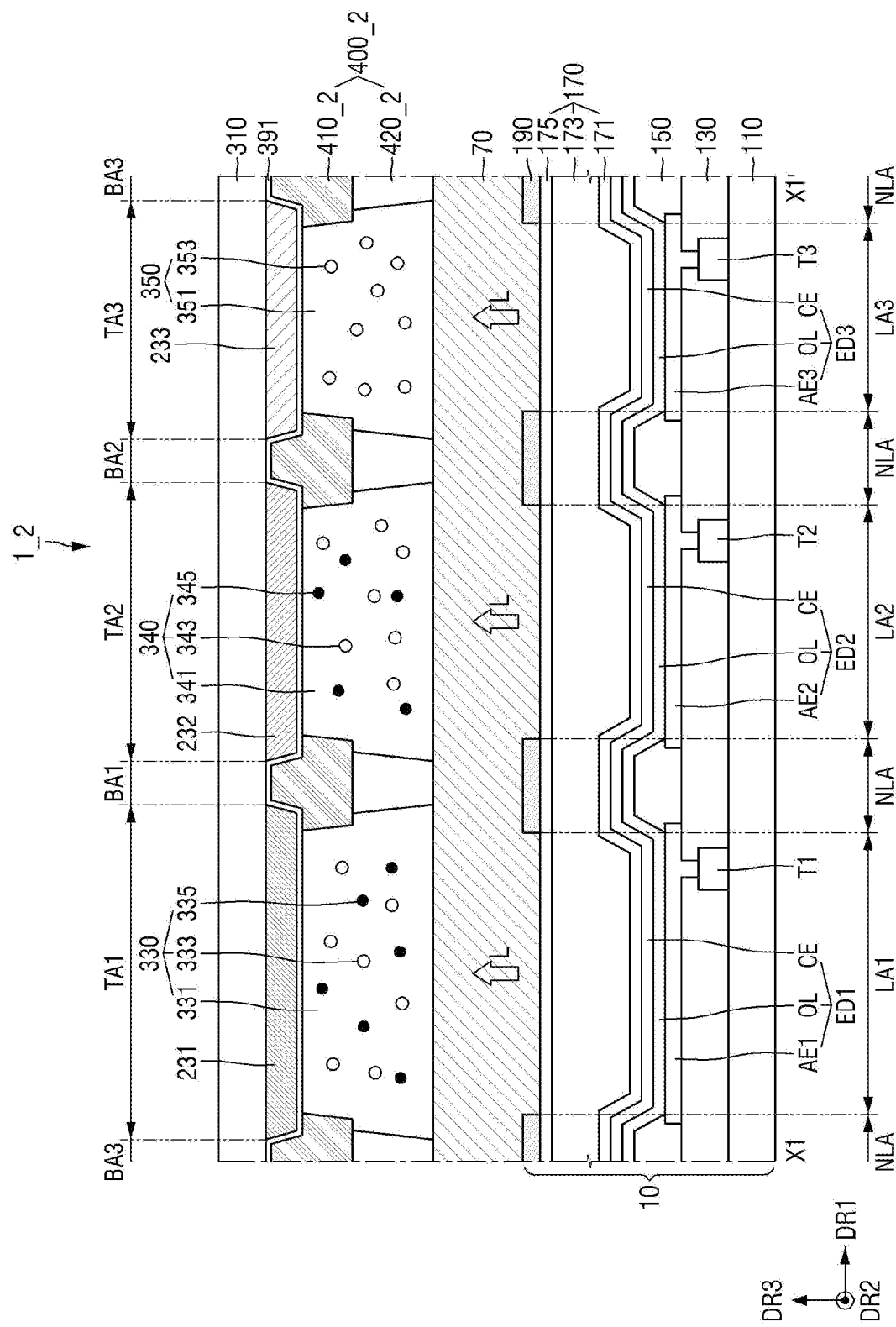

Referring to FIG. 21, a first partition layer 410_2 of a color conversion substrate 30_2 according to an embodiment may be made of a material including colorants other than the first color filter 231, the second color filter 232 and the third color filter 233. The color conversion substrate 30_2 according to the embodiment may differ from the color conversion substrate 30_1 of FIG. 20 in that the first partition layer 410_2 of a partition wall 400_2 may include a yellow colorant. Even in a case that the first partition layer 410_2 may include a yellow colorant, it may be possible to prevent light incident on the first wavelength conversion pattern 330, the second wavelength conversion pattern 340 and the light transmission pattern 350 from being emitted through the neighboring light transmitting region TA.

As described above with reference to FIGS. 20 and 21, the first partition layer 410 of the partition wall 400 may include the same material as the color filter. According to embodiments, the first partition layer 410 may be formed integrally with any color filter.

Figure 22:
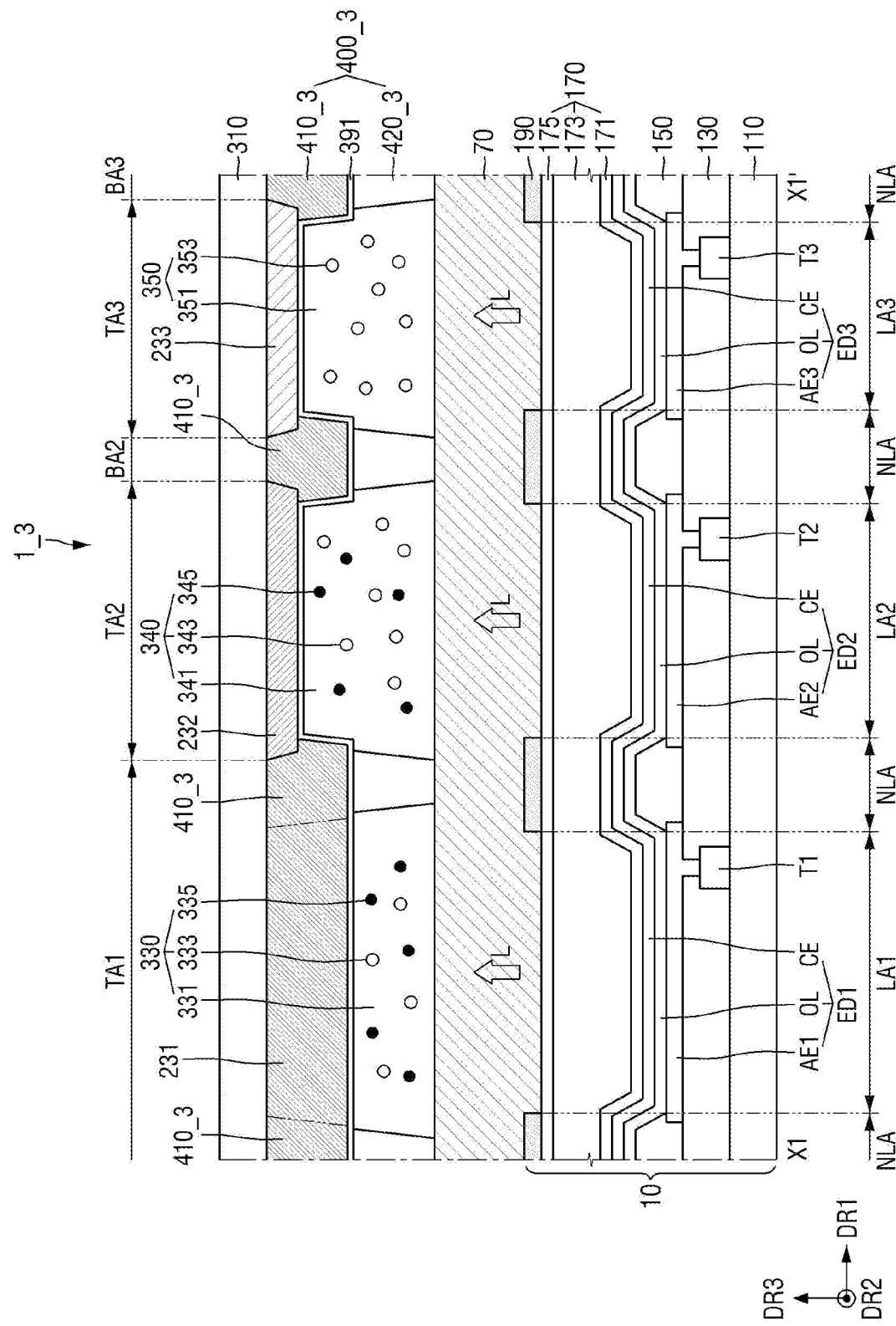
Figure 23:
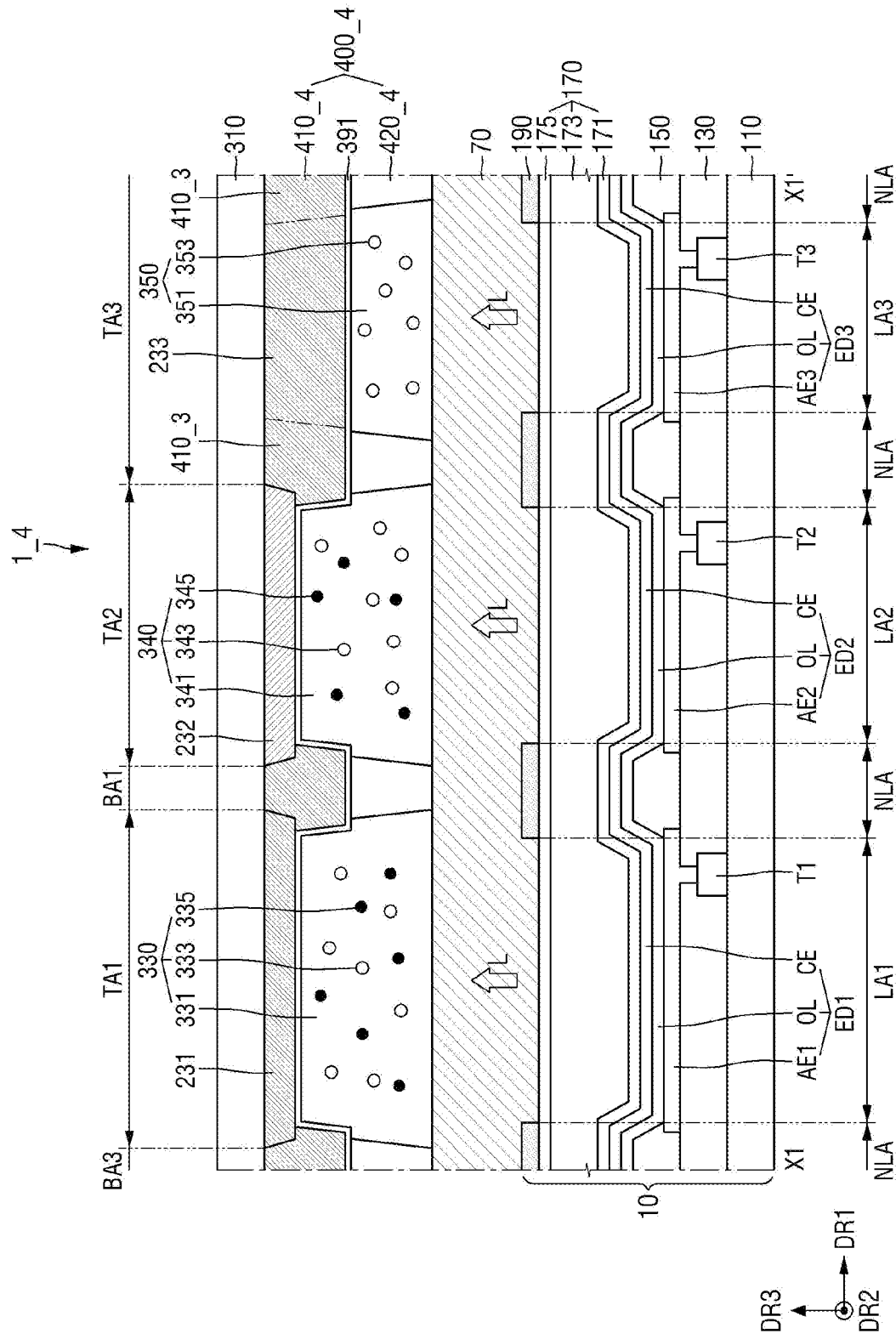

Referring to FIGS. 22 and 23, in color conversion substrates 30_3 and 30_4, first partition layers 410_3 and 410_4 may be integrated with the color filters 231 and 233, for example. The color conversion substrate 30_3 of FIG. 22 may be configured such that the first partition layer 410_3 includes the same material as the first color filter 231 and is formed integrally with the first color filter 231, and the color conversion substrate 30_4 of FIG. 23 may be configured such that the first partition layer 410_4 includes the same material as the third color filter 233 and is formed integrally with the third color filter 233. Thus, the color conversion substrates 30_3 and 30_4 differ from the color conversion substrate 30 of FIG. 5 in that the first partition layers 410_3 and 410_4 may be integrated with respective color filters.

The color conversion substrate 30_3 may be formed such that the first partition layer 410_3 may include the same material as the first color filter 231, thereby absorbing a portion of the light introduced from the outside to reduce occurrences of reflected light. The thickness of the first color filter 231 may be substantially the same as the first partition layer 410_3, such that they may be formed integrally. Thus, the first partition layer 410_3 may be formed simultaneously with the first color filter 231. Accordingly, a manufacturing process of the color conversion substrate 30_3 may be made more efficient via the aforementioned integration.

In the color conversion substrate 30_4 of FIG. 23, the first partition layer 410_4 may include the same material, i.e., a blue colorant, as that of the third color filter 233. The first partition layer 410_4 may be formed at the same time as the third color filter 233, and the thickness of the third color filter 233 may be substantially the same as that of the first partition layer 410_4, such that they may be formed integrally. In a case that the first partition layer 410_4 may include a blue colorant, external light or reflected light transmitted through the first partition layer 410_4 may have a blue wavelength band. Perception of a color by a user's eyes depends on the color of light. Light in the blue wavelength band may be perceived with a lesser sensitivity by the user than light in a green wavelength band and light in a red wavelength band. Therefore, since the first partition layer 410_4 may include a blue colorant, a viewer's sensitivity to the reflected light may be decreased.

In some embodiments, color filters may be disposed to be in contact with each other so as to not be spaced apart from each other.

Figure 24:
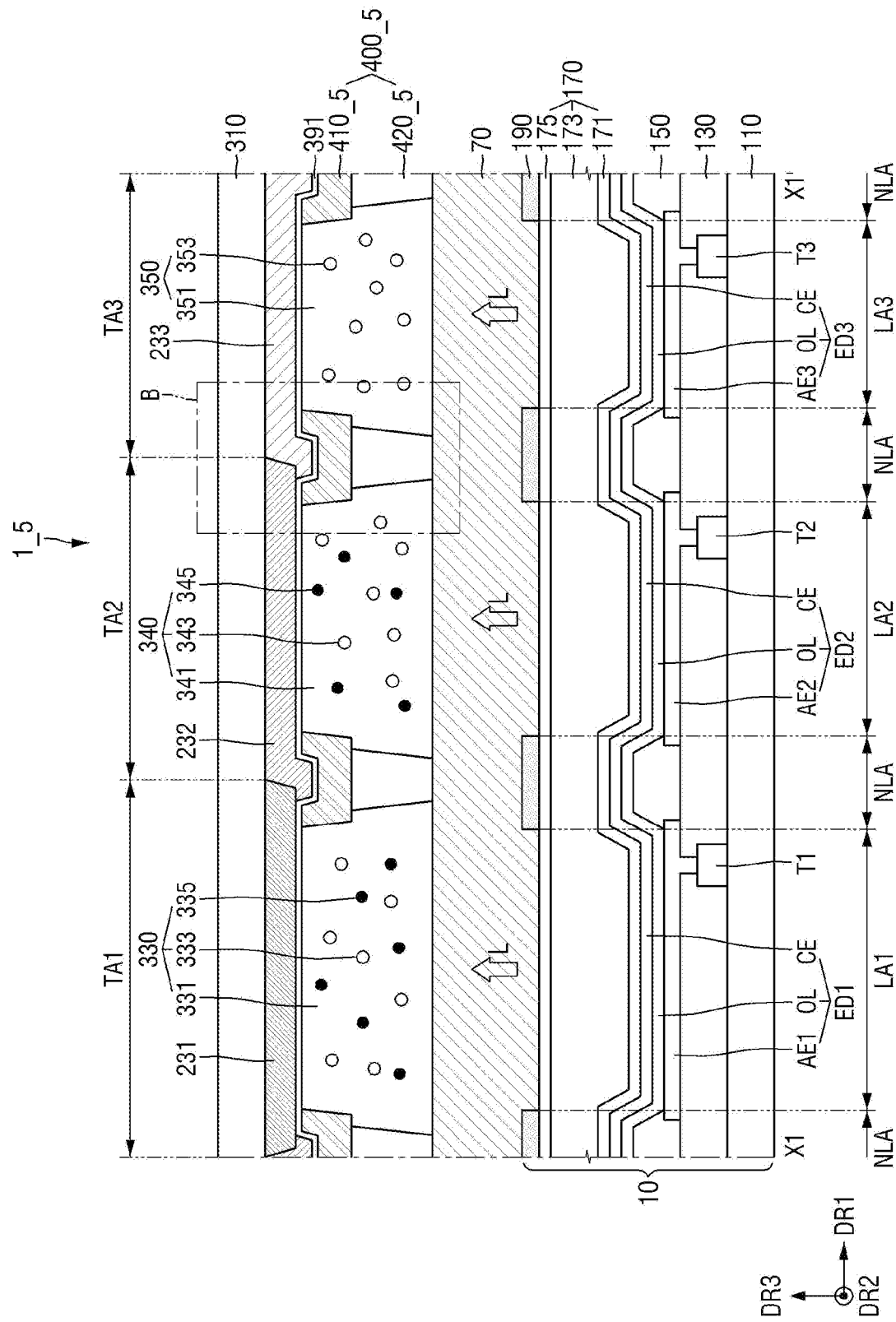
Figure 25:
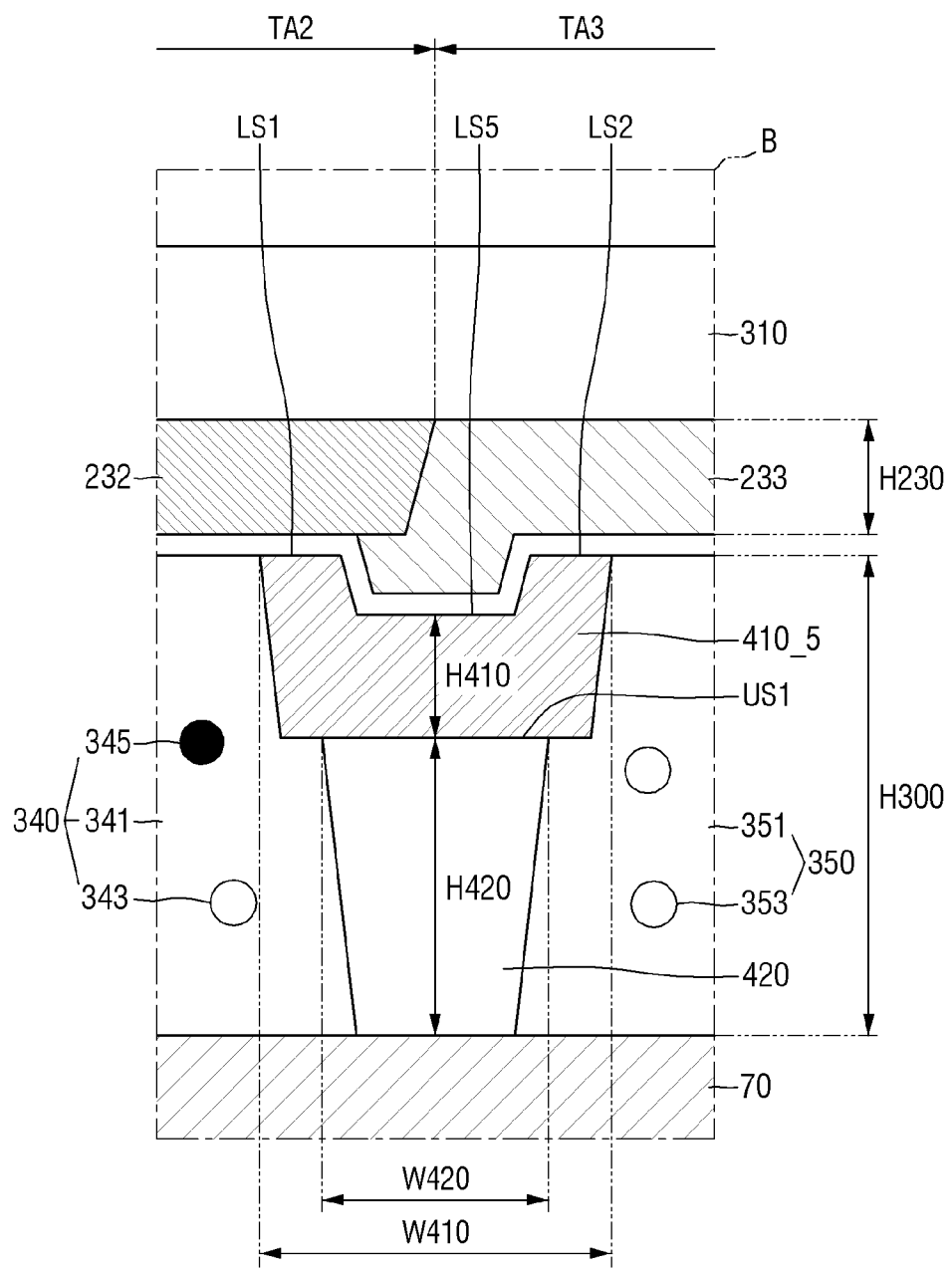
FIG. 25 shows an enlarged view of portion B of FIG. 24.

Referring to FIG. 24, in a color conversion substrate 30_5 according to an embodiment, color filters may overlap or face each other without being spaced apart from each other. Accordingly, a portion of one color filter may be located on another color filter. The color conversion substrate 30_5 may differ from the color conversion substrate 30 of FIG. 5 in that color filters may contact with each other. FIG. 25 shows an enlarged view of portion B of FIG. 24.

Referring to FIGS. 24 and 25, one color filter, i.e., the third color filter 233, may partially overlap or partially face another color filter, i.e., the second color filter 232. One side of the third color filter 233 may be disposed on one side of the second color filter 232, so as to be in contact with each other in an overlapping region. Accordingly, the first capping layer 391 may be disposed to cover the upper surfaces of the first color filter 231, the second color filter 232 and the third color filter 233, without being in contact with the second base substrate 310. The aforementioned overlapping color filter configuration may be obtained wherein the third color filter 233 and the second color filter 232 may not be spaced apart from each other and may be formed during manufacture of the color conversion substrate 30.

A first partition layer 410_5 may be disposed on a region where the color filters overlap each other. However, the width W410 of the first partition layer 410_5 may be larger than that of the region where the color filters overlap or face each other. The first partition layer 410_5 may include the first lower surface LS1 disposed on one color filter (i.e., the second color filter 232), the second lower surface LS2 disposed on another color filter (i.e., the third color filter 233), and the third lower surface LS3 disposed on a region where the second color filter 232 and the third color filter 233 overlap or face each other. Since the width W410 of the first partition layer 410_5 may be larger than that of the region where the second color filter 232 and the third color filter 233 overlap or face each other, the first lower surface LS1 and the second lower surface LS2 may each be respectively disposed only on one color filter. The first lower surface LS1 and the second lower surface LS2 may be disposed substantially in contact with the first capping layer 391, and may form a flat surface with the first capping layer 391. Accordingly, the partition wall 400_5 may have a symmetrical structure, and the first wavelength conversion pattern 330, the second wavelength conversion pattern 340 and the light transmission pattern 350 formed in regions partitioned by the partition wall 400_5 may be formed with a uniform volume.

The height H410 of the first partition layer 410_5 according to the embodiment may be smaller than the height H410 of the first partition layer 410 according to the embodiment of FIG. 14. The height of the partition wall 400_5 may be greater than those of at least the first wavelength conversion pattern 330, the second wavelength conversion pattern 340 and the light transmission pattern 350. However, in some embodiments, the height of the partition wall 400_5 may be adjusted such that the upper surface of a second partition layer 420_5 and the upper surfaces of the first wavelength conversion pattern 330, the second wavelength conversion pattern 340 and the light transmission pattern 350 may be disposed to be colinear. In a case that the height H420 of the second partition layer 420_5 of FIG. 25 may be the same as the height of the first partition layer 410_5 of FIG. 14, the height H410 of the first partition layer 410_5 may be relatively small. However, the disclosure may not be limited thereto.

As described above, in some embodiments, the first color filter 231, the second color filter 232 and the third color filter 233 may not be disposed in the seventh light blocking region BA7. For example, the first color filter 231, the second color filter 232 and the third color filter 233 disposed in the first row RT1 may be spaced apart from the first color filter 231, the second color filter 232 and the third color filter 233 disposed in the second row RT2. Thus, the partition wall 400 disposed in the seventh light blocking region BA7 may not overlap or face the first color filter 231, the second color filter 232 and the third color filter 233 in at least one of the first row RT1 and the second row RT2.

Figure 26:
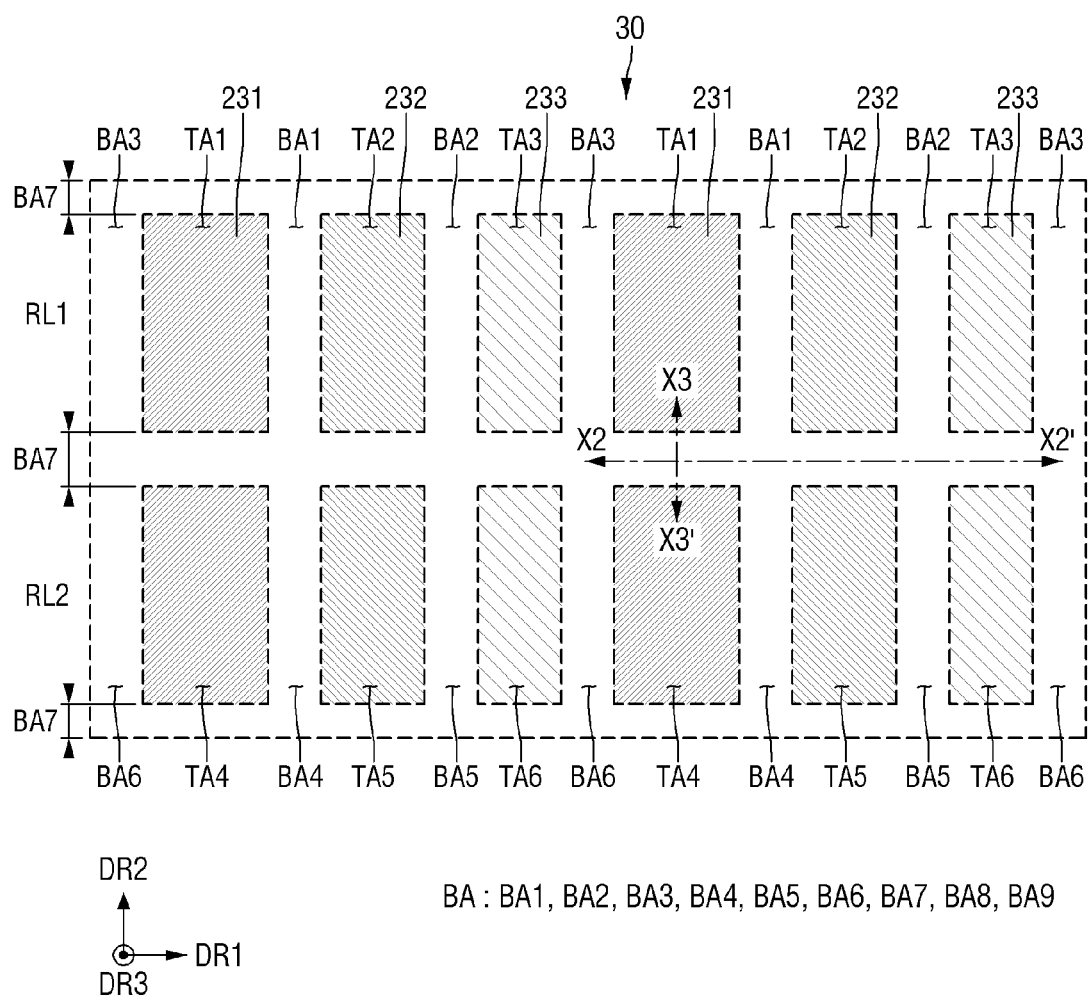
FIG. 26 shows a plan view illustrating an arrangement structure of a first color filter, a second color filter and a third color filter in a color conversion substrate according to another embodiment.
Figure 27:
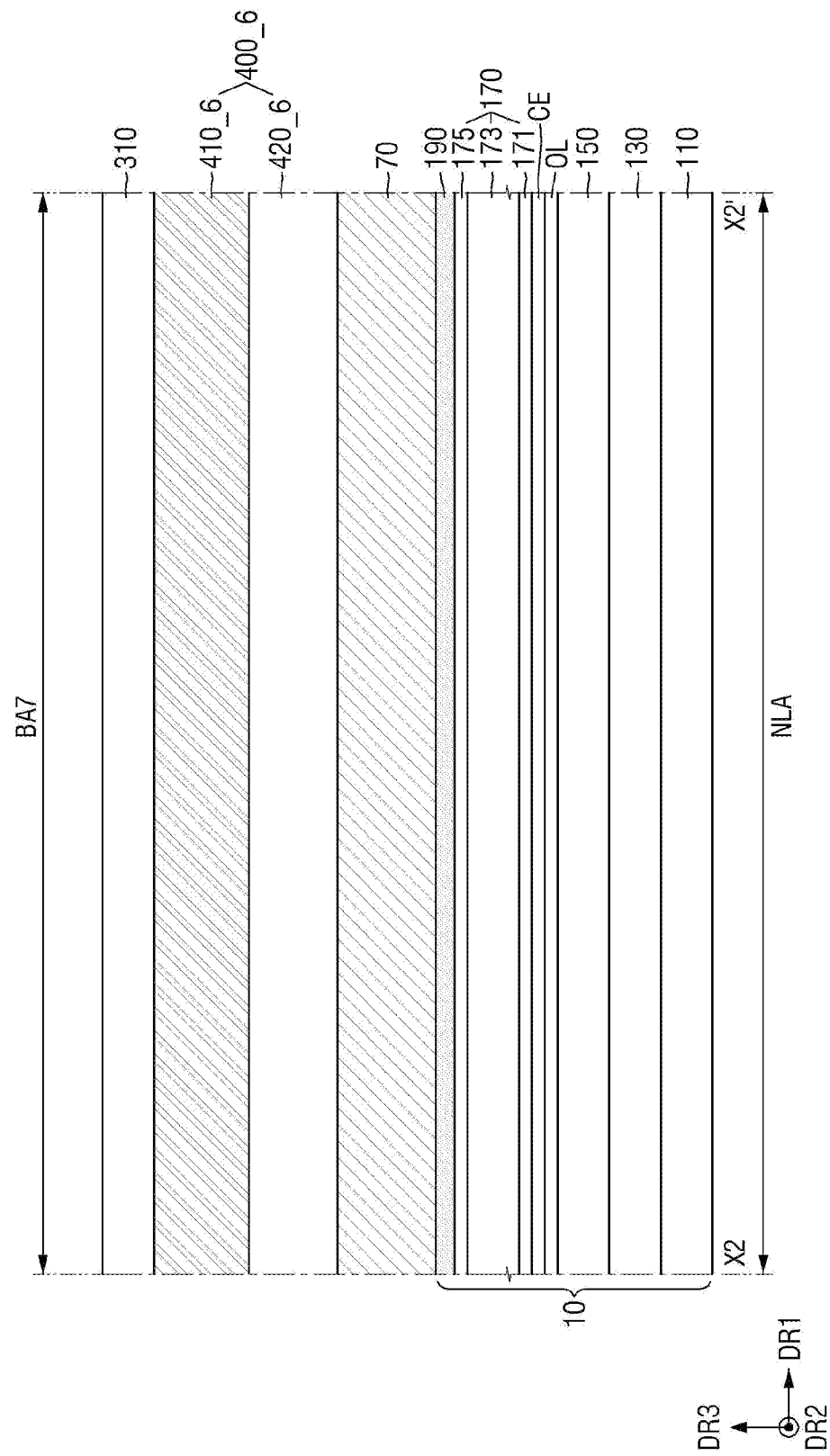
FIG. 27 shows a schematic cross-sectional view of a display device taken along line X2-X2' of FIG. 26.
Figure 28:
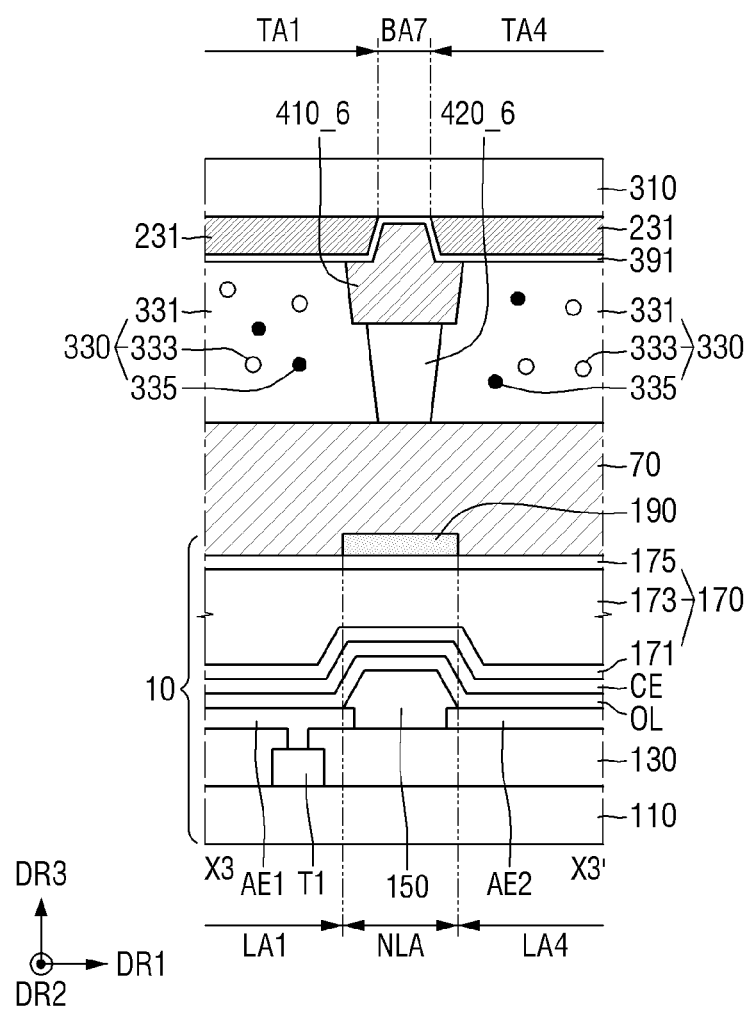
FIG. 28 shows a schematic cross-sectional view of a display device taken along line X3-X3' of FIG. 26.

FIG. 26 shows a plan view illustrating an arrangement structure of a first color filter 231, a second color filter 232 and a third color filter 233 in a color conversion substrate according to an embodiment. FIG. 27 shows a schematic cross-sectional view of a display device taken along line X2-X2' of FIG. 26. FIG. 28 shows a schematic cross-sectional view of a display device taken along line X3-X3' of FIG. 26.

Referring to FIGS. 26 to 28, according to an embodiment, the first color filter 231, the second color filter 232 and the third color filter 233 may be disposed in each light transmission region TA without extending in the second direction DR2. For example, the first color filter 231, the second color filter 232 and the third color filter 233 may have an island type configuration. Accordingly, the second base substrate 310, the first capping layer 391 and a partition wall 400_6 may be disposed in the seventh light blocking region BA7. A color conversion substrate 30_6 according to the differs from the color conversion substrate 30 of FIG. 5 in that the first color filter 231, the second color filter 232 and the third color filter 233 may be disposed in an island shape, and the partition wall 400_6 may not overlap a color filter in the seventh light blocking region BA7.

According to an embodiment, the first color filter 231, the second color filter 232 and the third color filter 233 may not be disposed in the seventh light blocking region BA7. The first color filter 231, the second color filter 232 and the third color filter 233 may be disposed, respectively, in the first light transmitting region TA1 or the fourth light transmitting region TA4, the second light transmitting region TA2 or the fifth light transmitting region TA5, and the third light transmitting region TA3 or the sixth light transmitting region TA6. A first partition layer 410_6 may be directly disposed on the second base substrate 310 and the first capping layer 391 in the seventh light blocking region BA7. The first partition layer 410_6 and a second partition layer 420_6 disposed in the seventh light blocking region BA7 may extend in the first direction DR1 and may partially overlap or face the light transmitting regions TA located in the first row RT1 and the second row RT2. For example, the width of the first partition layer 410_6 measured in the first direction DR1 may be larger than the width of the seventh light blocking region BA7 measured in the first direction DR1.

In concluding the detailed description, those skilled in the art will appreciate that many variations and modifications can be made to the embodiments herein without substantially departing from the principles thereof. Therefore, the disclosed embodiments should be understood in a generic and descriptive sense only, and not for purposes of limitation.

What is claimed is:

1. A color conversion substrate, comprising:
    a base substrate;
    a first color filter and a second color filter disposed on a surface of the base substrate;
    a capping layer disposed on the first color filter, the second color filter and the surface of the base substrate;
    a first partition layer disposed on the capping layer, and overlapping the first color filter and the second color filter;
    a second partition layer disposed on the first partition layer;
    a first wavelength conversion pattern disposed on the first color filter; and
    a second wavelength conversion pattern disposed on the second color filter, wherein
    the first partition layer includes a first lower surface disposed on the first color filter and a second lower surface disposed on the second color filter, and
    an upper surface of the first partition layer is greater than a lower surface of the second partition layer,
    wherein the second partition layer overlaps at least a portion of the first color filter and the second color filter, and is spaced apart from the first color filter and the second color filter,
    the lower surface of the capping layer is in direct contact with the first color filter and the second color filter, and
    the upper surface of the capping layer is in direct contact with the lower surface of the first partition layer.

2. The color conversion substrate of claim 1, wherein the first color filter and the second color filter are spaced apart from each other, and the first partition layer further includes a third lower surface disposed on the surface of the base substrate.

3. The color conversion substrate of claim 2, wherein the first partition layer includes a portion of which side surface is inclined from the third lower surface toward ends of the first lower surface and the second lower surface.

4. The color conversion substrate of claim 2, wherein the first lower surface and the second lower surface are parallel to the surface of the base substrate.

5. The color conversion substrate of claim 2, wherein a first width of the first partition layer is larger than a distance between the first color filter and the second color filter.

6. The color conversion substrate of claim 5, wherein a second width of the second partition layer is smaller than the first width of the first partition layer.

7. The color conversion substrate of claim 6, wherein the second width of the second partition layer is larger than a distance between the first color filter and the second color filter.

8. The color conversion substrate of claim 2, wherein a height of the first partition layer is greater than a thickness of any of the first color filter and the second color filter.

9. The color conversion substrate of claim 8, wherein a sum of heights of the first partition layer and the second partition layer is greater than a height of the first wavelength conversion pattern.

10. The color conversion substrate of claim 2, further comprising:
    a third color filter disposed on the one surface of the base substrate;
    a light transmission pattern disposed on the third color filter;
    a third partition layer disposed between the third color filter and the second color filter; and
    a fourth partition layer disposed on the third partition layer.

11. The color conversion substrate of claim 1, wherein at least a portion of the second color filter is disposed on the first color filter, and
    the first partition layer further includes a third lower surface disposed on the first color filter and the second color filter.

12. The color conversion substrate of claim 11, wherein a width of a region where the first color filter and the second color filter overlap each other is smaller than a width of the first partition layer.

13. The color conversion substrate of claim 1, wherein the first partition layer includes a same material as the first color filter.

14. The color conversion substrate of claim 13, wherein the first partition layer is integrated with the first color filter.

15. The color conversion substrate of claim 1, wherein the second partition layer overlaps at least a portion of the first color filter and the second color filter, and is spaced apart from the first color filter and the second color filter.

16. The color conversion substrate of claim 1, wherein an uppermost surface of the first partition layer is greater than a lowermost surface of the second partition layer.

17. The color conversion substrate of claim 1, wherein the first lower surface of the first partition layer is disposed on and directly over the first color filter and the second color filter.

18. A color conversion substrate, comprising:
    a base substrate including a first light transmitting region, a second light transmitting region separated from the first light transmitting region in a first direction, and a first light blocking region between the first light transmitting region and the second light transmitting region;
    a first color filter disposed on a surface of the base substrate to overlap the first light transmitting region;
    a second color filter disposed on the surface of the base substrate to overlap the second light transmitting region;
    a capping layer disposed on the first color filter, the second color filter and the surface of the base substrate;
    a partition wall overlapping the first light blocking region and disposed on the capping layer; and
    a first wavelength conversion pattern disposed on the first color filter and a second wavelength conversion pattern disposed on the second color filter, wherein the partition wall includes a first partition layer disposed on the first color filter and the second color filter and a second partition layer disposed on the first partition layer, the second partition layer overlaps at least a portion of the first color filter and the second color filter, and is spaced apart from the first color filter and the second color filter, the first partition layer includes a first lower surface disposed on the first color filter and a second lower surface disposed on the second color filter, an upper surface of the first partition layer is greater than a lower surface of the second partition layer, the lower surface of the capping layer is in direct contact with the first color first and the second color filter, and the upper surface of the capping layer is in direct contact with the first and second lower surfaces of the first partition layer.

19. The color conversion substrate of claim 18, wherein the first partition layer further includes a third lower surface disposed on the surface of the base substrate, and a portion of which side surface is inclined from the third lower surface toward ends of the first lower surface and the second lower surface.

20. The color conversion substrate of claim 18, wherein at least a portion of the first partition layer overlaps the first light transmitting region and the second light transmitting region.

21. The color conversion substrate of claim 20, wherein a width of the first partition layer is larger than a width of the first light blocking region.

22. The color conversion substrate of claim 20, wherein the first color filter and the second color filter extend in a second direction perpendicular to the first direction, and the partition wall extends in the second direction.

23. The color conversion substrate of claim 22, wherein the base substrate further comprises:
- a third light transmitting region separated from the first light transmitting region in the second direction; and
- a second light blocking region between the first light transmitting region and the third light transmitting region, wherein the partition wall overlaps the second light blocking region.

24. The color conversion substrate of claim 23, wherein a width of the partition wall is larger than a width of the second light blocking region.

* * * * *